United States Patent
Lee et al.

(10) Patent No.: US 11,961,553 B2
(45) Date of Patent: Apr. 16, 2024

(54) METHOD OF SEARCHING READ VOLTAGE OF NONVOLATILE MEMORY DEVICE USING REGRESSION ANALYSIS AND METHOD OF READING DATA FROM NONVOLATILE MEMORY DEVICE USING THE SAME

(71) Applicant: SAMSUNG ELECTRONICS CO., LTD., Suwon-si (KR)

(72) Inventors: Wijik Lee, Suwon-si (KR); Kwanwoo Noh, Hwaseong-si (KR); Hyeonjong Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 143 days.

(21) Appl. No.: 17/804,851

(22) Filed: May 31, 2022

(65) Prior Publication Data
US 2023/0119534 A1 Apr. 20, 2023

(30) Foreign Application Priority Data
Oct. 15, 2021 (KR) .......................... 10-2021-0137296

(51) Int. Cl.
| | |
|---|---|
| G11C 7/00 | (2006.01) |
| G11C 11/4074 | (2006.01) |
| G11C 11/4078 | (2006.01) |
| G11C 11/4096 | (2006.01) |

(52) U.S. Cl.
CPC ...... *G11C 11/4096* (2013.01); *G11C 11/4074* (2013.01); *G11C 11/4078* (2013.01)

(58) Field of Classification Search
CPC ....... G11C 7/1051; G11C 7/22; G11C 7/1072; G11C 7/1006; G11C 7/1066
USPC ..................................................... 365/189.15
See application file for complete search history.

(56) References Cited

U.S. PATENT DOCUMENTS

| | | | |
|---|---|---|---|
| 8,072,805 B2 | 12/2011 | Chou et al. | |
| 9,111,626 B2 | 8/2015 | Kim et al. | |
| 9,478,300 B2 | 10/2016 | Kim et al. | |
| 9,552,887 B2 | 1/2017 | Kim et al. | |
| 9,688,206 B1 | 6/2017 | Choi et al. | |
| 10,878,920 B2 | 12/2020 | Hong et al. | |
| 11,024,401 B1 | 6/2021 | Khayat et al. | |
| 2020/0210096 A1 | 7/2020 | Kim et al. | |
| 2021/0000906 A1 | 3/2021 | Tokutomi et al. | |

FOREIGN PATENT DOCUMENTS

KR 10-2038408 10/2019

*Primary Examiner* — Son T Dinh
(74) *Attorney, Agent, or Firm* — F.CHAU & ASSOCIATES, LLC

(57) ABSTRACT

A nonvolatile memory device includes a plurality of memory cells that have a first state and a second state different from each other. A method of searching a read voltage of the nonvolatile memory device includes determining a number n that represents a number of times a data read operation is performed, selecting n read voltage levels of the read voltage such that a number of read voltage levels is equal to the number of times the data read operation, where the n read voltage levels differ from each other, generating n cell count values by performing n data read operations on the plurality of memory cells using all of the n read voltage levels, and generating an optimal read voltage level of the read voltage by performing a regression analysis based on a first-order polynomial using the n read voltage levels and the n cell count values.

20 Claims, 22 Drawing Sheets

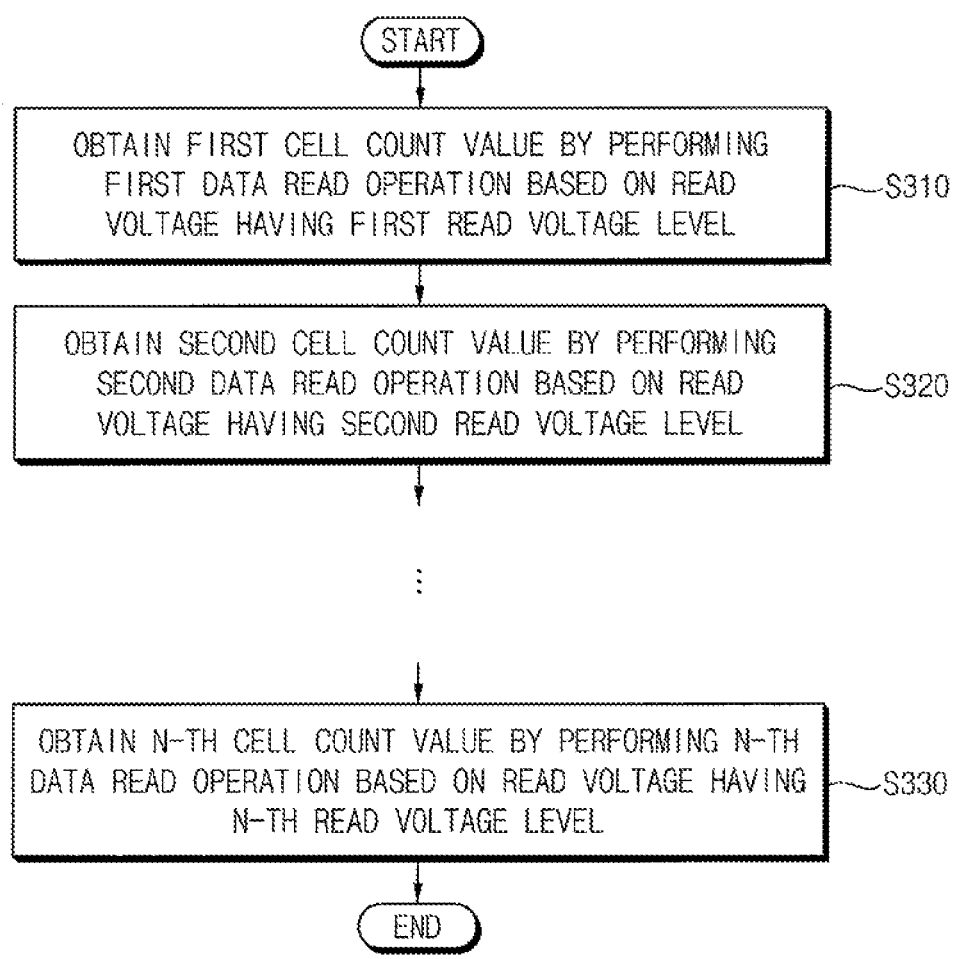

METHOD OF SEARCHING READ VOLTAGE OF NONVOLATILE MEMORY DEVICE USING REGRESSION ANALYSIS AND METHOD OF READING DATA FROM NONVOLATILE MEMORY DEVICE USING THE SAME

CROSS-REFERENCE TO RELATED APPLICATION

This application claims priority under 35 USC § 119 from Korean Patent Application No. 10-2021-0137296, filed on Oct. 15, 2021 in the Korean Intellectual Property Office (KIPO), the contents of which are herein incorporated by reference in their entirety.

TECHNICAL FIELD

Embodiments of the disclosure are directed to semiconductor integrated circuits, and more particularly to methods of searching read voltages of nonvolatile memory devices using regression analysis, and methods of reading data from nonvolatile memory devices using the methods of searching the read voltages.

DISCUSSION OF THE RELATED ART

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices can perform read and write operations at a high speed, while contents stored therein may be lost at power-off. Nonvolatile memory devices retain contents stored therein even at power-off, which means they may be used to store data that must be retained regardless of whether they are powered.

To store data, memory cells in a nonvolatile memory device are programmed to have threshold voltage distributions representing different states. During (and/or following) the programming of the memory cells, their intended threshold voltage distributions may undesirably shift or broaden due to charge leakage, program disturbances, word and/or bit line couplings, temperature changes, voltage changes, etc., and the threshold voltage distributions may overlap each other.

SUMMARY

Embodiments of the present disclosure provide a method of searching a read voltage of a nonvolatile memory device wherein the method can quickly and accurately determine an optimal voltage level of the read voltage used in a data read operation based on a regression analysis.

Embodiments of the present disclosure provide a method of reading data from a nonvolatile memory device using a method of searching the read voltage.

According to embodiments, a method of searching a read voltage of a nonvolatile memory device that includes a plurality of memory cells having a first state and a second state that differ from each other includes determining a number n that represents a number of times a data read operation is performed, where n is an integer greater than or equal to two, selecting n read voltage levels of the read voltage such that a number of read voltage levels is equal to the number of times the data read operation, where the n read voltage levels differ from one another, generating n cell count values by performing n data read operations on the plurality of memory cells using all of the n read voltage levels, and generating an optimal read voltage level of the read voltage by performing a regression analysis based on a first-order polynomial using the n read voltage levels and the n cell count values. The read voltage is used to distinguish the first state and the second state.

According to embodiments, a method of reading data from a nonvolatile memory device that includes a plurality of memory cells that has a plurality of states includes searching a plurality of read voltages used to distinguish the plurality of states, and reading the data stored in the plurality of memory cells based on the plurality of read voltages. The plurality of states include a first state and a second state that differ from each other. The plurality of read voltages include a first read voltage that is used to distinguish the first state and the second state. Searching the plurality of read voltages includes determining a number n that represents a number of times a data read operation is performed, where n is an integer greater than or equal to two, selecting n first read voltage levels of the first read voltage such that a number of first read voltage levels is equal to the number of times the data read operation, where the n first read voltage levels differ from one another, generating n first cell count values by performing n data read operations on the plurality of memory cells using all of the n first read voltage levels, and determining as first optimal read voltage level of the first read voltage by performing a regression analysis based on a first-order polynomial using the n first read voltage levels and the n first cell count values.

According to embodiments, a method of searching a read voltage of a nonvolatile memory device that includes a plurality of memory cells that have a first state and a second state that differ from each other includes determining a number n that represents a number of times a data read operation is performed, where n is an integer greater than or equal to two, selecting a first read voltage level to an n-th read voltage level of the read voltage such that a number of read voltage levels is equal to the number of times the data read operation, where the first to n-th read voltage levels differ from one another, generating a first cell count value to an n-th cell count value by performing a first data read operation to an n-th data read operation on the plurality of memory cells using all of the first to n-th read voltage levels, obtaining a first variable to an (n−1)-th variable based on the first to n-th read voltage levels and the first to n-th cell count values, where each of the first to (n−1)-th variables includes an averaged read voltage level and a cell count change value, obtaining a first function by performing a regression analysis based on a first-order polynomial using the first to (n−1)-th variables, where the first function is estimated as a first-order polynomial, and calculating an optimal read voltage level of the read voltage based on the first function. The read voltage is used to distinguish the first state and the second state. The optimal read voltage level of the read voltage is obtained based on Equation 1, Equation 2 and Equation 3 as follows:

$$-\frac{b}{a} = \frac{\sum X_i^2 \sum Y_i - \sum X_i \sum X_i Y_i}{\sum X_i \sum Y_i - n \sum X_i Y_i};$$ Equation 1

$$X_i = (x_i + x_{i+1})/2;$$ Equation 2

$$Y_i = y_{i+1} - y_i.$$ Equation 3

In Equation 2, $X_i$ denotes an (i+1)-th averaged read voltage level, i is an integer greater than or equal to zero and less than or equal to (n−2), and $x_i$ and $x_{i+1}$ denote an (i+1)-th read voltage level and an (i+2)-th read voltage level, respectively. In Equation 3, $Y_i$ denotes an (i+1)-th cell count change value, and $y_i$ and $y_{i+1}$ denote an (i+1)-th cell count value and an (i+2)-th cell count value, respectively.

In a method of searching the read voltage of a nonvolatile memory device and a method of reading data from a nonvolatile memory device according to embodiments, a single data read operation is performed using one read voltage level, the n data read operations are performed using the n read voltage levels that differ from each other, and the n cell count values are obtained by performing the n data read operations. In addition, the amount of change in the cell count values is obtained using the n read voltage levels and the n cell count values, the regression analysis is based on the first-order polynomial rather than based on a second-order polynomial and is performed using the amount of change in the cell count values, and thus the optimal read voltage level of the read voltage is determined by performing the regression analysis based on the first-order polynomial. Accordingly, the amount of calculations or computation for determining the optimal read voltage level of the read voltage is reduced, and the optimal read voltage level of the read voltage is determined quickly and accurately.

BRIEF DESCRIPTION OF THE DRAWINGS

FIG. 8 is a flowchart of a method of generating n cell count values in FIG. 1.

DETAILED DESCRIPTION

Figure 1:
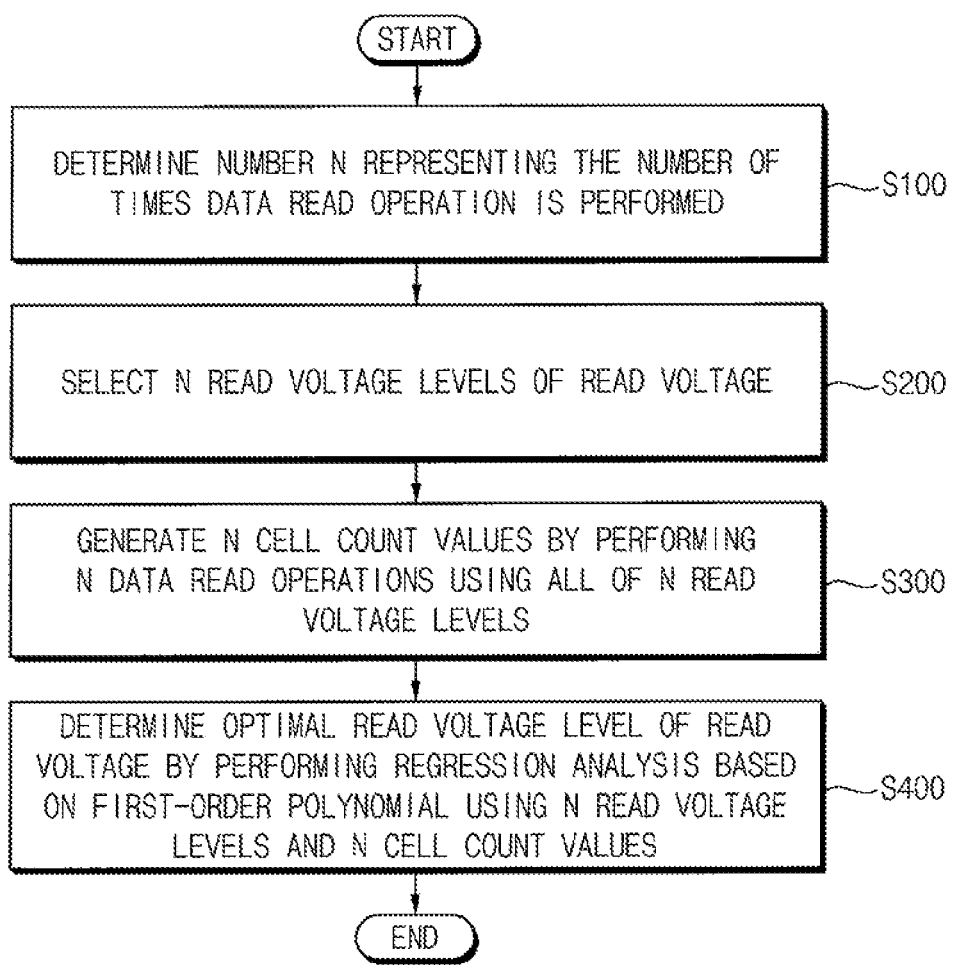
FIG. 1 is a flowchart of a method of searching a read voltage of a nonvolatile memory device according to embodiments.

Various embodiments will be described more fully with reference to the accompanying drawings, in which embodiments are shown. Embodiments of the present disclosure may, however, take many different forms and should not be construed as limited to embodiments set forth herein. Like reference numerals may refer to like elements throughout the specification.

FIG. 1 is a flowchart of a method of searching a read voltage of a nonvolatile memory device according to embodiments.

Referring to FIG. 1, a method of searching a read voltage according to embodiments is performed by a nonvolatile memory device that includes a plurality of memory cells and a memory controller that controls an operation of the nonvolatile memory device. Examples of a nonvolatile memory device, a memory controller and a memory system including thereof will be described with reference to FIGS. 2 through 6.

The plurality of memory cells have a first state and a second state that differ from each other, and the read voltage is used to distinguish the first state from the second state. The first and second states may be included in a plurality of consecutive states. Examples of the first and second states and the plurality of states including thereof will be described with reference to FIGS. 7A and 7B.

In a method of searching the read voltage of a nonvolatile memory device according to embodiments, a number n is determined, where n is an integer greater than or equal to two (step S100). The number n represents the number of times a data read operation is performed. For example, a read number signal that includes the number n is generated as a result of performing step S100. In some embodiments, the number n is predetermined at an initial operation time of the nonvolatile memory device, such as when the nonvolatile memory device is manufactured. In other embodiments, the number n can change in real time or during runtime while the nonvolatile memory device is driving or operating.

The n read voltage levels of the read voltage are selected such that the number of read voltage levels is equal to the number of times the data read operation is performed (step S200). For example, to be equal to the number of times the data read operation is performed, the n read voltage levels of the read voltage are selected. The n read voltage levels differ from each other. For example, the n read levels include a first read voltage level to an n-th read voltage level that differ from each other. A read voltage level selection signal that includes the n read voltage levels is generated as a result of performing step S200.

The n cell count values are generated by performing n data read operations on the plurality of memory cells using all of the n read voltage levels (step S300). For example, the n data read operations include a first data read operation to an n-th data read operation that differ from each other, and the n cell count values include a first cell count value to an n-th cell count value that differ from each other. A cell count signal that includes the n cell count values is generated as a result of performing step S300. Step S300 will be described with reference to FIGS. 8, 9A and 9B.

In some embodiments, a read voltage level used in one of the n data read operations differs from read voltage levels used in the remaining n data read operations. For example, a read voltage level used in the first data read operation differs from read voltage levels used in the second to n-th data read operations. For example, each of the n data read operations may be performed based on different read levels, a single data read operation may be performed using one read voltage level, and two or more data read operations may be performed using different read voltage levels.

An optimal read voltage level of the read voltage is determined or detected by performing a regression analysis based on a first-order polynomial using the n read voltage levels and the n cell count values (step S400). For example, the regression analysis is performed using the amount of change in the cell count values, rather than the cell count values by themselves. For example, an optimal read voltage level signal that includes the optimal read voltage level is generated as a result of performing step S400. Step S400 will be described with reference to FIGS. 10 and 11.

In a method of searching the read voltage of a nonvolatile memory device according to embodiments, a single data read operation may be performed using one read voltage level, the n data read operations may be performed using to different read voltage levels, and thus the n cell count values are obtained by performing the n data read operations. In addition, the amount of change in the cell count values is obtained using the n read voltage levels and the n cell count values, the regression analysis based on the first-order polynomial, rather than based on a second-order polynomial, is performed using the amount of change in the cell count values, and thus the optimal read voltage level of the read voltage is determined by performing the regression analysis based on the first-order polynomial. Accordingly, the amount of calculation or computation for determining the optimal read voltage level of the read voltage is reduced, and the optimal read voltage level of the read voltage is determined quickly and accurately.

Figure 2:
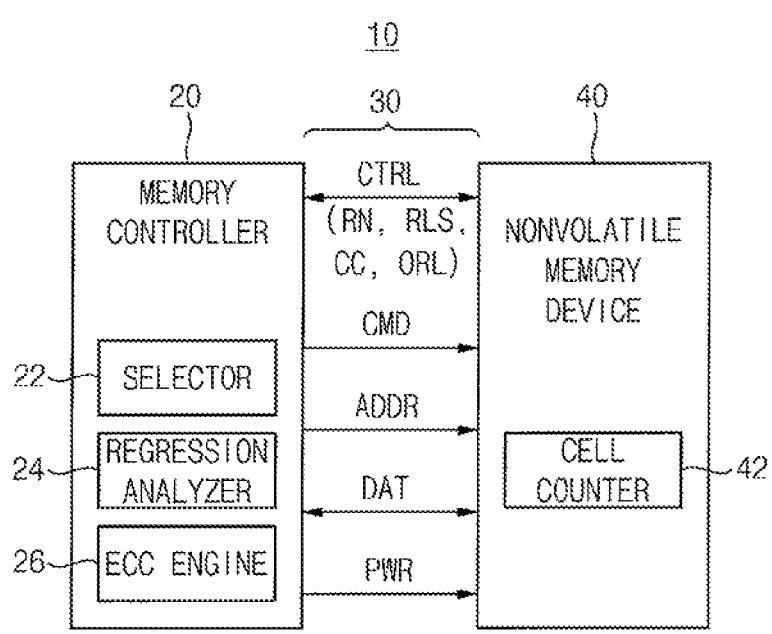
FIG. 2 is a block diagram of a memory system that includes a nonvolatile memory device according to embodiments.

FIG. 2 is a block diagram of a memory system that includes a nonvolatile memory device according to embodiments.

Referring to FIG. 2, in some embodiments, a memory system 10 includes a memory controller 20 and a nonvolatile memory device 40. The memory system 10 further includes a plurality of signal lines 30 that electrically connect the memory controller 20 with the nonvolatile memory device 40.

The nonvolatile memory device 40 is controlled by the memory controller 20. For example, based on requests from a host, the memory controller 20 stores, e.g., writes or programs, data into the nonvolatile memory device 40, or retrieves, e.g., reads or senses, data from the nonvolatile memory device 40.

The plurality of signal lines 30 include control lines, command lines, address lines, data input/output (I/O) lines and power lines. The memory controller 20 can transmit a command CMD and an address ADDR to the nonvolatile memory device 40 via the command lines and the address lines, may exchange a data signal DAT and a control signal CTRL with the nonvolatile memory device 40 via the data I/O lines and the control lines, and may transmit a power supply voltage PWR to the nonvolatile memory device 40 via the power lines. In addition, the plurality of signal lines 30 may further include data strobe signal (DQS) lines for transmitting a DQS signal.

The memory system 10 performs a method of searching the read voltage according to embodiments described with reference to FIG. 1. For example, the memory controller 20 includes a selector 22 and a regression analyzer 24, and the nonvolatile memory device 40 includes a cell counter 42.

The selector 22 generates a read number signal RN by determining a number n that represents the number of times a data read operation is performed, and a read voltage level selection signal RLS by selecting n read voltage levels of the read voltage. The cell counter 42 performs n data read operations using all of the n read voltage levels, and generates a cell count signal CC by generating n cell count values based on the n data read operations. The regression analyzer 24 performs a regression analysis based on a first-order polynomial using the n read voltage levels and the n cell count values, and generates an optimal read voltage level signal ORL by determining an optimal read voltage level of the read voltage. For example, the read number signal RN, the read voltage level selection signal RLS, the cell count signal CC and the optimal read voltage level signal ORL are included in the control signal CTRL.

The memory system 10 also performs a method of searching a read voltage according to embodiments, which will be described with reference to FIGS. 15 and 17. In addition, the memory controller 20 further includes an error correction code (ECC) engine 26.

In some embodiments, the memory system 10 is implemented as a storage device such as a solid state drive (SSD), a universal flash storage (UFS), a multi-media card (MMC) or an embedded multi-media card (eMMC). In other embodiments, the memory system 10 is implemented as a secure digital (SD) card, a micro SD card, a memory stick, a chip card, a universal serial bus (USB) card, a smart card, or a compact flash (CF) card, etc.

Figure 3:
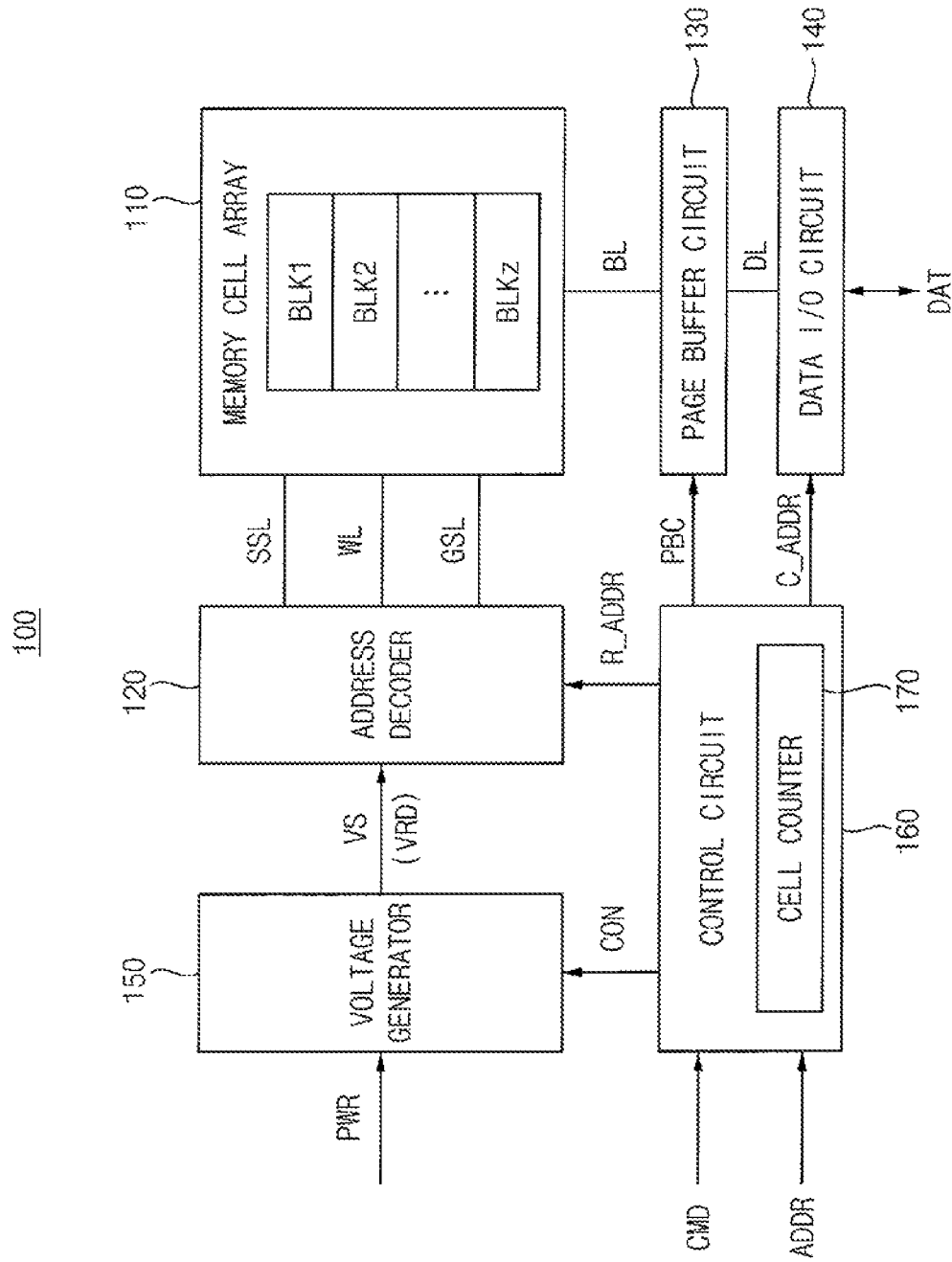
FIG. 3 is a block diagram of a nonvolatile memory device according to embodiments.

FIG. 3 is a block diagram of a nonvolatile memory device according to embodiments.

Referring to FIG. 3, in some embodiments, a nonvolatile memory device 100 includes a memory cell array 110, an address decoder 120, a page buffer circuit 130, a data input/output (I/O) circuit 140, a voltage generator 150 and a control circuit 160.

The memory cell array 110 is connected to the address decoder 120 via a plurality of string selection lines SSL, a plurality of wordlines WL and a plurality of ground selection lines GSL. The memory cell array 110 is further connected to the page buffer circuit 130 via a plurality of bitlines BL. The memory cell array 110 includes a plurality of memory cells, such as a plurality of nonvolatile memory cells, that are connected to the plurality of wordlines WL and the plurality of bitlines BL. The memory cell array 110 is divided into a plurality of memory blocks BLK1, BLK2, . . . , BLKz each of which includes memory cells. In addition, each of the plurality of memory blocks BLK1, BLK2, . . . , BLKz is divided into a plurality of pages.

In some embodiments, as will be described with reference to FIGS. 4 and 5, the memory cell array 110 is a three-dimensional (3D) memory cell array that is formed on a substrate in a three-dimensional structure or a vertical structure. In this example, the memory cell array 110 includes a plurality of cell strings, such as a plurality of vertical NAND strings, that are vertically oriented such that at least one memory cell is located over another memory cell.

In some embodiments, the plurality of memory cells include multi-level memory cells (MLCs) each of which stores two or more data bits. Hereinafter, the term multi-level memory cell will include not only a memory cell that stores two data bits, but also a memory cell that stores three data bits, such as a triple-level memory cell (TLC), a memory cell that stores four data bits, such as a quad-level memory cell (QLC), etc. However, embodiments are not necessarily limited thereto, and the plurality of memory cells may include single-level memory cells (SLCs) each of which stores one data bit.

The control circuit 160 receives a command CMD and an address ADDR from a memory controller, such as the memory controller 20 in FIG. 2, and controls erasure, program and read operations of the nonvolatile memory device 100 based on the command CMD and the address ADDR. An erasure operation includes performing a sequence of erase loops, and a program operation includes performing a sequence of program loops. Each program loop includes a program operation and a program verification operation. Each erase loop includes an erase operation and an erase verification operation. The read operation includes a normal read operation and data recovery read operation.

For example, the control circuit 160 generates control signals CON that are used to control the voltage generator 150, and generates control signals PBC that control the page buffer circuit 130, based on the command CMD, and generates a row address R_ADDR and a column address C_ADDR based on the address ADDR. The control circuit 160 provides the row address R_ADDR to the address decoder 120 and the column address C_ADDR to the data I/O circuit 140.

The control circuit 160 includes a cell counter 170 that performs a method of searching the read voltage according to embodiments. The cell counter 170 is substantially the same as the cell counter 42 in FIG. 2. In some embodiments, the cell counter 170 is disposed outside the control circuit 160 and connected to the page buffer circuit 130. The cell counter 170 may be referred to as a mass bit counter (MBC).

The address decoder 120 is connected to the memory cell array 110 via the plurality of string selection lines SSL, the plurality of wordlines WL and the plurality of ground selection lines GSL.

For example, in the data erase/write/read operations, the address decoder 120 determines at least one of the plurality of wordlines WL as a selected wordline, and determines the remainder of the plurality of wordlines WL other than the selected wordline as unselected wordlines, based on the row address R_ADDR.

In addition, in the data erase/write/read operations, the address decoder 120 determines at least one of the plurality of string selection lines SSL as a selected string selection line, and determine the remainder of the plurality of string selection lines SSL other than the selected string selection line as unselected string selection lines, based on the row address R_ADDR.

Further, in the data erase/write/read operations, the address decoder 120 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 150 generates voltages VS used in an operation of the nonvolatile memory device 100 based on a power PWR signal and the control signal CON. The voltages VS are transmitted to the plurality of string selection lines SSL, the plurality of wordlines WL and the plurality of ground selection lines GSL via the address decoder 120. For example, the voltages VS include read voltages VRD.

For example, during an erase operation, the voltage generator 150 transmits an erase voltage to a common source line and/or the bitline BL of a memory block, such as a selected memory block, and transmits an erase permission voltage, such as a ground voltage, to all wordlines of the memory block or a portion of the wordlines via the address decoder 120. In addition, during an erase verification operation, the voltage generator 150 may simultaneously transmit an erase verification voltage to all wordlines of the memory block or sequentially transmit the erase verification voltage to the wordlines one by one.

For example, during a program operation, the voltage generator 150 transmits a program voltage to the selected wordline and transmits a program pass voltage to the unselected wordlines via the address decoder 120. In addition, during a program verification operation, the voltage generator 150 transmits a program verification voltage to the selected wordline and transmits a verification pass voltage to the unselected wordlines via the address decoder 120.

In addition, during a normal read operation, the voltage generator 150 transmits one of the read voltages VRD to the selected wordline and transmits a read pass voltage to the unselected wordlines via the address decoder 120. During a data recovery read operation, the voltage generator 150 transmits one of the read voltages VRD to a wordline adjacent to the selected wordline and transmits a recovery read voltage to the selected wordline via the address decoder 120.

The page buffer circuit 130 is connected to the memory cell array 110 via the plurality of bitlines BL. The page buffer circuit 130 includes a plurality of page buffers. In some embodiments, each page buffer is connected to one bitline. In other embodiments, each page buffer is connected to two or more bitlines.

The page buffer circuit 130 stores data DAT to be programmed into the memory cell array 110 or reads data DAT sensed from the memory cell array 110. For example, the page buffer circuit 130 may operate as a write driver or a sensing amplifier according to an operation mode of the nonvolatile memory device 100.

The data I/O circuit 140 is connected to the page buffer circuit 130 via data lines DL. The data I/O circuit 140 provides the data DAT received from an external device to the memory cell array 110 via the page buffer circuit 130 or outputs the data DAT read from the memory cell array 110 from the nonvolatile memory device 100, based on the column address C_ADDR.

Figure 4:
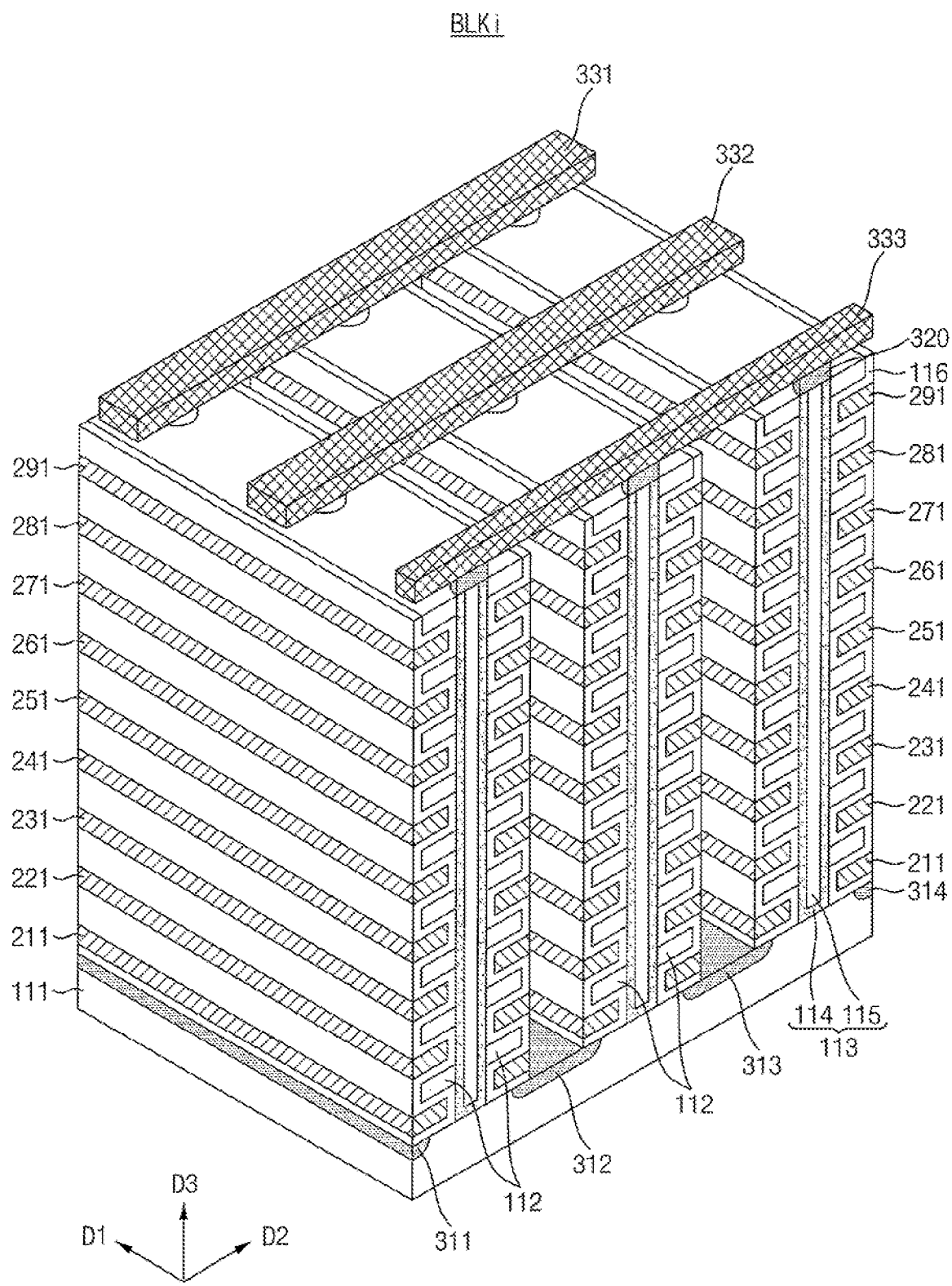
FIG. 4 is a perspective view of a memory block in a memory cell array of a nonvolatile memory device of FIG. 3.

FIG. 4 is a perspective view of a memory block in a memory cell array of a nonvolatile memory device of FIG. 3.

Referring to FIG. 4, in some embodiments, a memory block BLKi includes a plurality of cell strings, such as a plurality of vertical NAND strings, that are formed on a substrate in a three-dimensional or vertical structure. The memory block BLKi includes structures that extend along the first, second and third directions D1, D2 and D3.

A substrate 111 is provided. The substrate 111 includes a well of a first charge carrier impurity type, such as a first conductivity type, therein. For example, the substrate 111 has a p-well formed by implanting a group 3 element such as boron (B). In particular, the substrate 111 includes a pocket p-well provided within an n-well. In an embodiment, the substrate 111 includes a p-type well or a p-type pocket well. However, the conductive types of the substrate 111 are not necessarily limited to a p-type.

A plurality of doping regions 311, 312, 313 and 314 are provided along the second direction D2 in/on the substrate 111. These plurality of doping regions 311 to 314 have a second charge carrier impurity type, such as a second conductivity type, that differs from the first type of the substrate 111. In an embodiment, the first to fourth doping regions 311 to 314 are n-type. However, the conductive type of the first to fourth doping regions 311 to 314 is not necessarily limited to an n-type.

A plurality of insulation materials 112 that extend along the first direction D1 are sequentially stacked in the third direction D3 on a region of the substrate 111 between the first and second doping regions 311 and 312. For example, the plurality of insulation materials 112 that are stacked in the third direction D3 are spaced by a predetermined distance. The insulation materials 112 include an insulation material such as an oxide layer.

A plurality of pillars 113 that penetrate the insulation materials along the third direction D3 are sequentially disposed along the first direction D1 on a region of the substrate 111 between the first and second doping regions 311 and 312, between the second and third doping regions 312 and 313, and between the third and fourth doping regions 313 and 314. The plurality of pillars 113 penetrate the insulation materials 112 and contact the substrate 111.

In some embodiments, each pillar 113 includes a plurality of materials. For example, a channel layer 114 of each pillar 113 includes a silicon material of the first conductivity type. For example, the channel layer 114 of each pillar 113 includes a silicon material that has the same conductivity type as the substrate 111. In an embodiment, the channel layer 114 of each pillar 113 includes p-type silicon. However, the channel layer 114 of each pillar 113 is not necessarily limited to p-type silicon.

An internal material 115 of each pillar 113 includes an insulation material. For example, the internal material 115 of each pillar 113 includes a silicon oxide. In some embodiments, the internal material 115 of each pillar 113 includes an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312, between the second and third doping regions 312 and 313, and between the third and fourth doping regions 313 and 314. For example, the insulation layer 116 is interposed between the pillars 113 and a plurality of stacked first conductive materials 211, 221, 231, 241, 251, 261, 271, 281 and 291, as illustrated. The insulation layer 116 zig-zags in the second direction D2 around the insulation materials 112 and the stacked first conductive materials 211, 221, 231, 241, 251, 261, 271, 281 and 291. For example, the insulation layer 116 is folded around the insulation materials 112 and the stacked first conductive materials 211, 221, 231, 241, 251, 261, 271, 281 and 291 in the second direction, so that the insulation materials 112 alternate with the first conductive materials 211, 221, 231, 241, 251, 261, 271, 281 and 291 with the insulation layer 116 therebetween. In some embodiments, the insulation layer 116 is not provided between those first conductive materials 211 to 291 that correspond to ground selection lines GSL, such as 211, and string selection lines SSL, such as 291. In an embodiment, the ground selection lines GSL are the lowermost lines of the stack of first conductive materials 211 to 291 and the string selection lines SSL are the uppermost lines of the stack of first conductive materials 211 to 291.

The plurality of first conductive materials 211 to 291 are provided on surfaces of the insulation layer 116, in a region between the first and second doping regions 311 and 312, between the second and third doping regions 312 and 313, and between the third and fourth doping regions 313 and 314. For example, the first conductive material 211 that extends along the first direction D1 is disposed between the insulation material 112 adjacent to the substrate 111 and the substrate 111. For example, the first conductive material 211 that extends along the first direction D1 is interposed between consecutive folds of the insulation layer 116 at the bottom of the stack of first conductive materials 211, 221, 231, 241, 251, 261, 271, 281 and 291, adjacent to the substrate 111.

A first conductive material that extends along the first direction D1 is interposed between the insulation layer 116 and the insulation materials 112. For example, a plurality of first conductive materials 221 to 281 that extend along the first direction D1 are provided between the insulation materials 112, and the insulation layer 116 is provided between the insulation materials 112 and the first conductive materials 221 to 281. The first conductive materials 211 to 291 are formed of a conductive metal, but in other embodiments of the invention the first conductive materials 211 to 291 include a conductive material such as a polysilicon.

The same structures as those on the first and second doping regions 311 and 312 are provided in a region between the second and third doping regions 312 and 313. In the region between the second and third doping regions 312 and 313, a plurality of insulation materials 112 are provided, which extend along the first direction D1. In addition, a plurality of pillars 113 are provided that are disposed sequentially along the first direction D1 and penetrate the plurality of insulation materials 112 in the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 are provided in a region between the third and fourth doping regions 313 and 314.

A plurality of drain regions 320 are disposed on the plurality of pillars 113, respectively. The drain regions 320 include silicon materials doped with a second charge carrier impurity type. For example, the drain regions 320 include silicon materials doped with an n-type dopant. In an embodiment, the drain regions 320 include n-type silicon materials. However, the drain regions 320 are not necessarily limited to n-type silicon materials.

A plurality of second conductive materials 331, 332 and 333 that extend along the second direction D2 are disposed on the drain regions. The second conductive materials 331 to 333 are spaced apart from each other along the first direction D1 by a predetermined distance. The second conductive materials 331 to 333 are respectively connected to the drain regions 320 in a corresponding region. The drain regions 320 and the second conductive material 333 are connected by contact plugs. Each contact plug is, for example, a conductive plug formed of a conductive material such as a metal. The second conductive materials 331 to 333 include metal. The second conductive materials 331 to 333 include conductive materials such as polysilicon.

In an example of FIG. 4, the first conductive materials 211 to 291 are used to form the wordlines WL, the string selection lines SSL and the ground selection lines GSL. For example, the first conductive materials 221 to 281 form the wordlines WL, where conductive materials belonging to the same layer are interconnected. The second conductive materials 331 to 333 form the bitlines BL. The number of layers of the first conductive materials 211 to 291 can vary according to process and control techniques.

Figure 5:
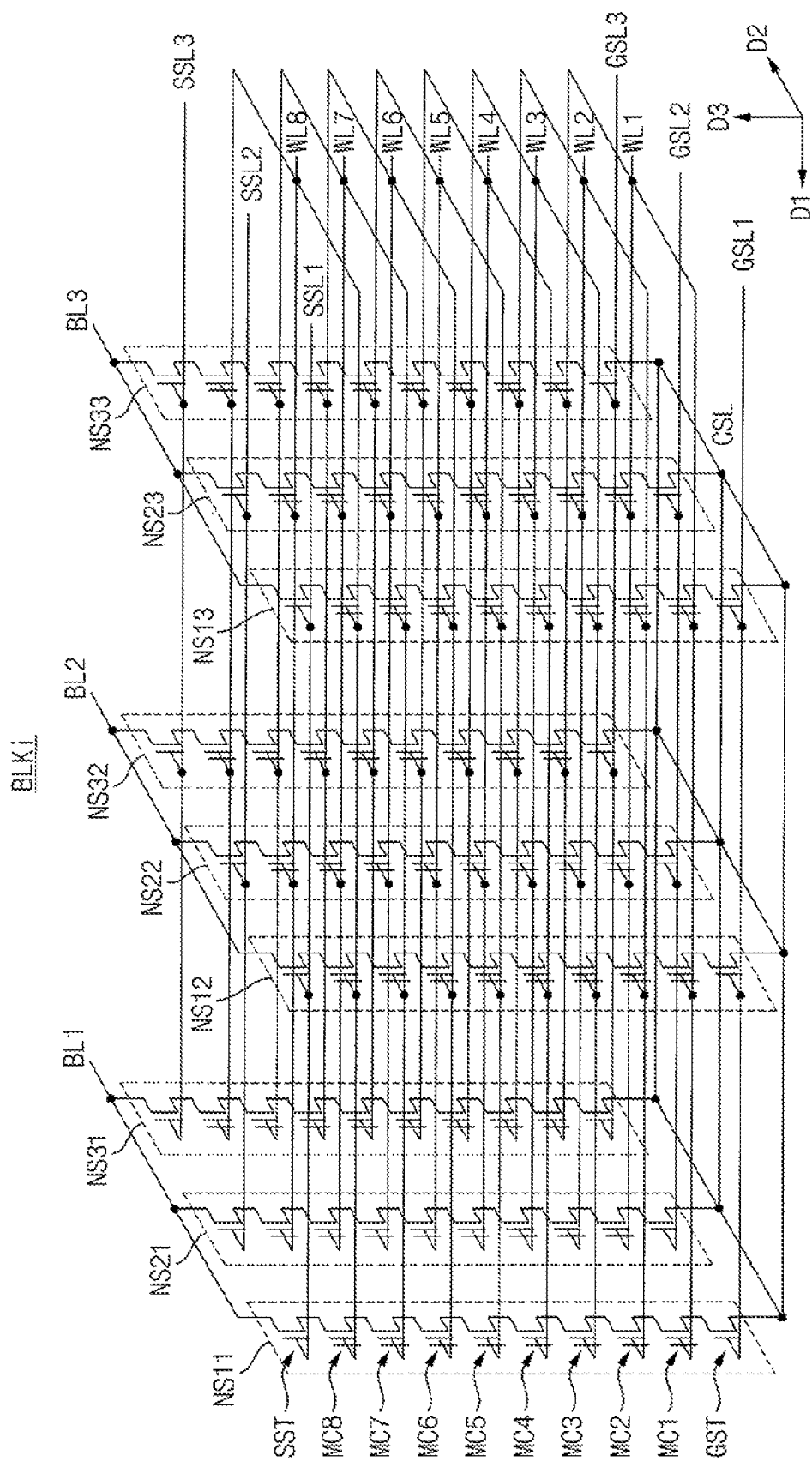
FIG. 5 is a circuit diagram of a memory block described with reference to FIG. 4.

FIG. 5 is a circuit diagram of an equivalent circuit of a memory block described with reference to FIG. 4.

A memory block BLKi of FIG. 5 is formed on a substrate in a three-dimensional or vertical structure. For example, a plurality of NAND strings in the memory block BLKi extend in a direction perpendicular to the substrate.

Referring to FIG. 5, in some embodiments, the memory block BLKi includes a plurality of NAND strings NS11, NS12, NS13, NS21, NS22, NS23, NS31, NS32 and NS33 connected between bitlines BL1, BL2 and BL3 and a common source line CSL. Each of the NAND strings NS11 to NS33 includes a string selection transistor SST, a plurality of memory cells MC1, MC2, MC3, MC4, MC5, MC6, MC7 and MC8, and a ground selection transistor GST. For example, the bitlines BL1 to BL3 correspond to the second conductive materials 331 to 333 in FIG. 4, and the common source line CSL is formed by interconnecting the first to fourth doping regions 311 to 314 in FIG. 4.

Each string selection transistor SST is connected to a corresponding string selection line, such as one of SSL1, SSL2 or SSL3. The plurality of memory cells MC1 to MC8 are connected to corresponding wordlines WL1, WL2, WL3, WL4, WL5, WL6, WL7 and WL8, respectively. Each ground selection transistor GST is connected to a corresponding ground selection line, such as one of GSL1, GSL2 or GSL3. Each string selection transistor SST is connected to a corresponding bitline, such as one of BL1 to BL3, and each ground selection transistor GST is connected to the common source line CSL. In the embodiment of FIG. 5, some of the string selection transistors SST are connected to the same bitline, such as one of BL1 to BL3, to connect corresponding NAND strings to the same bitline so that appropriate selection via voltages can be applied to the appropriate sting selection lines SSL1 to SSL3 and ground selection lines GSL1 to GSL3.

The cell strings connected in common to one bitline form one column, and the cell strings connected to one string selection line form one row. For example, the cell strings NS11, NS21 and NS31 connected to the first bitline BL1 correspond to a first column, and the cell strings NS11, NS12 and NS13 connected to the first string selection line SSL1 form a first row.

Wordlines, such as WL1, that have the same height are commonly connected, and the ground selection lines GSL1 to GSL3 and the string selection lines SSL1 to SSL3 are separated. Memory cells located in the same semiconductor layer share a wordline. Cell strings in the same row share a string selection line. The common source line CSL is connected in common to all cell strings.

FIG. 5 illustrates the memory block BLKi as being connected to eight wordlines WL1 to WL8 and three bitlines BL1 to BL3, and illustrates each of the NAND strings NS11 to NS33 as including eight memory cells MC1 to MC8. However, embodiments are not necessarily limited thereto. In some embodiments, each memory block is connected to any number of wordlines and bitlines, and each NAND string includes any number of memory cells.

A three-dimensional vertical array structure includes vertical NAND strings that are vertically oriented such that at least one memory cell is located over another memory cell. The at least one memory cell may comprise a charge trap layer.

Although a memory cell array included in a nonvolatile memory device according to embodiments is described in terms of a NAND flash memory device, a nonvolatile memory device according to embodiments may be any nonvolatile memory device, such as a phase random access memory (PRAM), a resistive random access memory (RRAM), a nano floating gate memory (NFGM), a polymer random access memory (PoRAM), a magnetic random access memory (MRAM), a ferroelectric random access memory (FRAM), or a thyristor random access memory (TRAM), etc.

Figure 6:
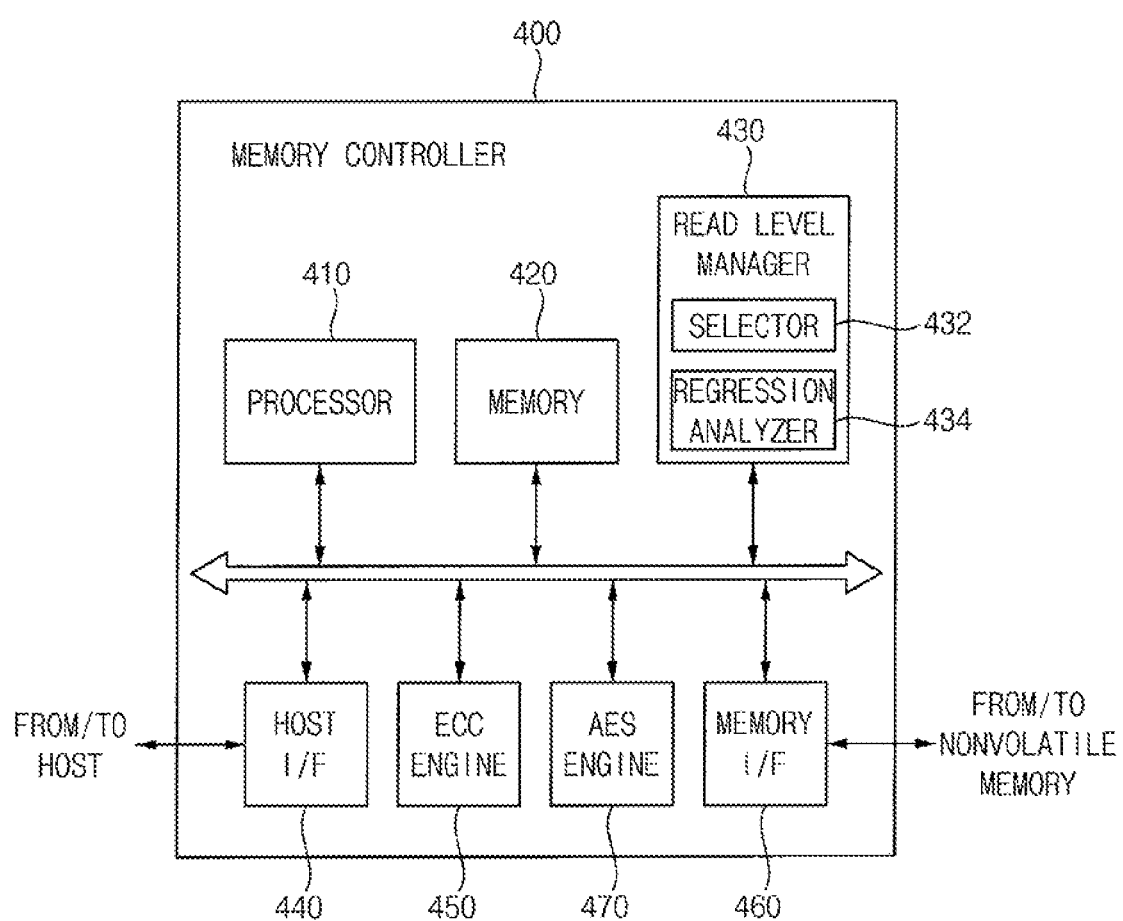
FIG. 6 is a block diagram of a memory controller that controls a nonvolatile memory device according to embodiments.

FIG. 6 is a block diagram of a memory controller that controls a nonvolatile memory device according to embodiments.

Referring to FIG. 6, in some embodiments, a memory controller 400 includes a processor 410, a memory 420, a read level manager 430, a host interface 440, an error correction code (ECC) engine 450, a memory interface 460 and an advanced encryption standard (AES) engine 470.

The processor 410 controls an operation of the memory controller 400 in response to a command received via the host interface 440 from a host. For example, the processor 410 controls an operation of a memory system, such as the memory system 10 in FIG. 2, and controls respective components using firmware to operate the memory system.

The memory 420 stores instructions and data executed and processed by the processor 410. The memory 420 is implemented as a volatile memory, such as a static random access memory (SRAM) or a dynamic random access memory (DRAM), etc.

The read level manager 430 is used to perform a method of searching the read voltage according to embodiments, and includes a selector 432 and a regression analyzer 434. The selector 432 and the regression analyzer 434 are substantially the same as the selector 22 and the regression analyzer 24 in FIG. 2, respectively. In some embodiments, at least a part of the read level manager 430 is implemented as hardware. For example, at least a part of the read level manager 430 is included in a computer-based electronic system. In other embodiments, at least a part of the read level manager 430 is implemented as instruction code or program routines, such as a software program. The instruction code or program routines are executed by a computer-based electronic system, and can be stored in any storage device located inside or outside the computer-based electronic system.

The ECC engine 450 performs error correction using at least one of a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), or a block coded modulation (BCM), etc., or performs ECC encoding and ECC decoding using above-described codes or other error correction codes. The ECC engine 450 corresponds to the ECC engine 26 in FIG. 2.

The host interface 440 provides physical connections between the host and the memory system. The host interface 440 provides an interface that corresponds to a bus format of the host for communication between the host and the memory system. In some embodiments, the bus format of the host is a small computer system interface (SCSI) or a serial attached SCSI (SAS) interface. In other embodiments, the bus format of the host is a USB, a peripheral component interconnect (PCI) express (PCIe), an advanced technology attachment (ATA), a parallel ATA (PATA), a serial ATA (SATA), or a nonvolatile memory (NVM) express (NVMe), etc., format.

The memory interface 460 exchanges data with a nonvolatile memory device, such as the nonvolatile memory device 40 in FIG. 2. The memory interface 460 transmits data to the nonvolatile memory device, or receives data read from the nonvolatile memory device. In some embodiments, the memory interface 460 is connected to the nonvolatile memory device via one channel. In other embodiments, the memory interface 460 is connected to the nonvolatile memory device via two or more channels. For example, the memory interface 460 can be configured to comply with a standard protocol, such as Toggle or the open NAND flash interface (ONFI).

The AES engine 470 performs at least one of an encryption operation or a decryption operation on data input to the memory controller 400 by using a symmetric-key algorithm. In addition, the AES engine 470 may include an encryption module and a decryption module. For example, the encryption module and the decryption module are implemented as separate modules. For example, one module that can perform both encryption and decryption operations is implemented in the AES engine 470.

Figure 7A:
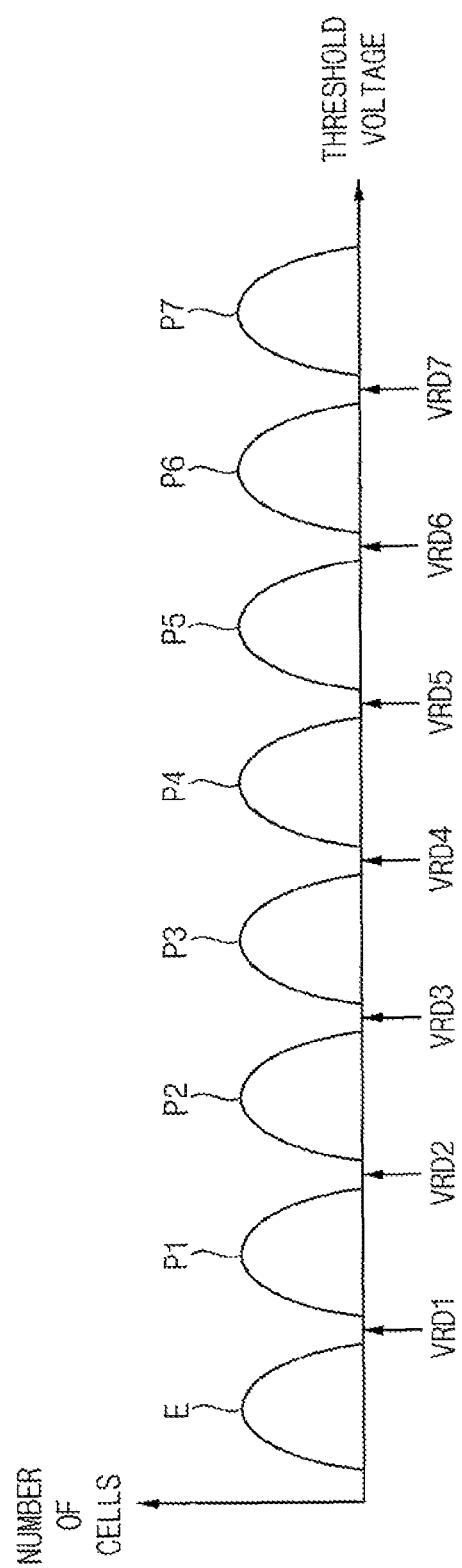
FIGS. 7A and 7B illustrate a distribution of threshold voltages of memory cells in a nonvolatile memory device according to embodiments.
Figure 7B:
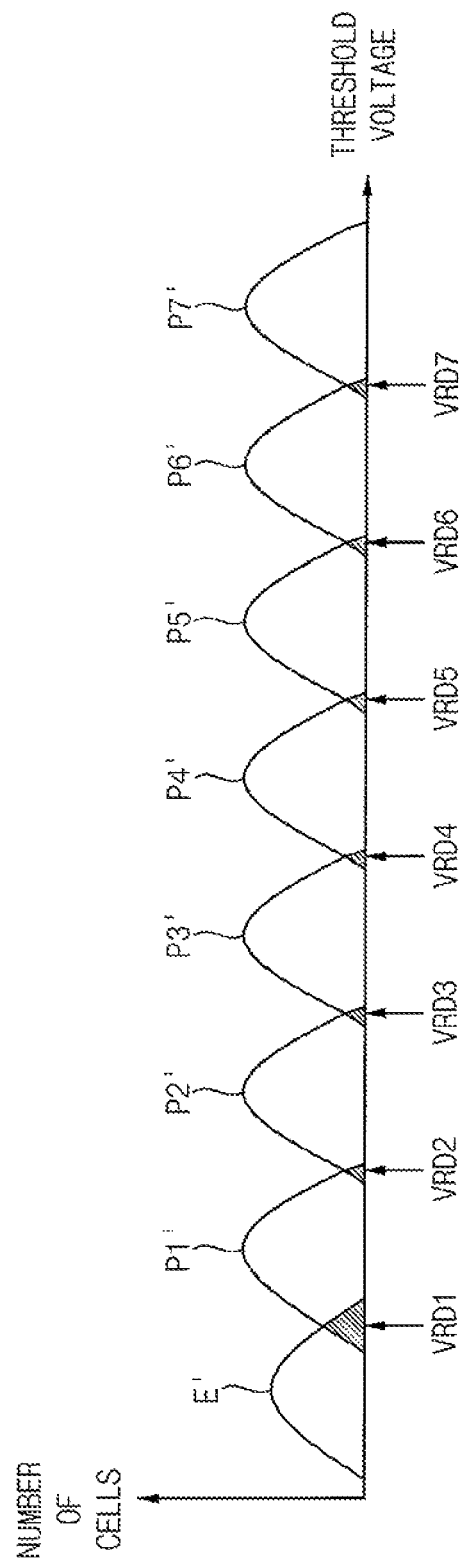

FIGS. 7A and 7B illustrate a distribution of threshold voltages of memory cells in a nonvolatile memory device according to embodiments.

Referring to FIG. 7A, in some embodiments, a distribution of threshold voltages of the plurality of memory cells is illustrated based on an example in which the plurality of memory cells are TLCs that each stores 3-bit data.

The plurality of memory cells have an erase state E and first to seventh program states P1, P2, P3, P4, P5, P6 and P7. A read voltage set that determines states of the plurality of memory cells includes first to seventh read voltages VRD1, VRD2, VRD3, VRD4, VRD5, VRD6 and VRD7. One read voltage may have a read voltage level between two states. For example, the first read voltage VRD1 may have a read voltage level between the erase state E and the first program state P1.

Under control of a memory controller, such as the memory controller 20 in FIG. 2, a nonvolatile memory device, such as the nonvolatile memory device 40 in FIG. 2, determines states, such as the erase state E or the program states P1 to P7, of the memory cells using the read voltages VRD1 to VRD7, and outputs read data. For example, when the first read voltage VRD1 is applied to a control electrode, such as a gate electrode, of the memory cell, the memory cell in the erase state E is turned on, whereas the memory cell MCEL in the first program state P1 may be turned off. A current flows through the memory cell when the memory cell is turned on, and no current flows through the memory cell when the memory cell is turned off. Thus, data stored in the memory cell is determined, distinguished or discriminated depending on whether the memory cell is turned on. For example, it may be determined that data '1' is stored when a memory cell is turned on in response to the first read voltage VRD1 being applied thereto, and data '0' is stored when a memory cell is turned off in response to the first read voltage VRD1 being applied thereto.

Referring to FIG. 7B, in some embodiments, a distribution of threshold voltages of the plurality of memory cells is illustrated that varies from the distribution of the threshold voltages of FIG. 7A.

With respect to the memory cells in the erase state E and the program states P1 to P7 in FIG. 7A, the distribution of threshold voltages of the memory cells can change due to physical characteristics of the memory cells or external factors, such as stimulus, wear, etc. as time elapses after the memory cells are programmed, as illustrated in FIG. 7B. For example, the memory cells have a different erase state E' and different program states P1', P2', P3', P4', P5', P6' and P7'.

Read voltage levels of the read voltages VRD1 to VRD7 are determined depending on a distribution of threshold voltages immediately after the memory cells are programmed. Thus, when a data read operation is performed using the read voltages VRD1 to VRD7 as it is after the distribution of the threshold voltages has changed, read data obtained by the data read operation may include an error, and the reliability of the nonvolatile memory device may be degraded or deteriorated. For example, read errors may occur on memory cells that correspond to hatched areas. For example, when a data read operation is performed using the first read voltage VRD1, even if the memory cells within the hatched area are programmed in the first program state P1, the memory cells within the hatched area may be determined to be in the erase state E due to a decrease in threshold voltages.

The optimal read voltage level of the read voltage can be determined based on a shape of the distribution of the memory cells. As the memory cell distributionvaries, the optimal read voltage level of the read voltage required for reading data from the nonvolatile memory device can change. Thus, the optimal read voltage level of the read voltage can be determined by changing the read voltage level of the read voltage based on the variation of the distribution. According to embodiments, the calculation time and power consumption are reduced by simplifying the calculation for determining the optimal read voltage level of the read voltage, and thus the optimal read voltage level of the read voltage can be efficiently determined.

Although examples in which the memory cells are TLCs have been described with reference to FIGS. 7A and 7B, embodiments are not limited thereto. For example, the memory cells may be QLCs which each stores 4-bit data, or may be implemented in various other configurations. For example, when each of the memory cells store j-bit data, where j is an integer greater than or equal to two, the memory cells has $2^j$ states, and the states of the memory cells are determined using ($2^j$-1) read voltages. Alternatively, the nonvolatile memory device includes memory cells that are programmed with a different number of bits.

FIG. 8 is a flowchart of a method of generating n cell count values in FIG. 1.

Referring to FIGS. 1 and 8, in some embodiments, when generating the n cell count values (step S300), the first cell count value is generated by performing the first data read operation based on the read voltage at the first read voltage level (step S310), a second cell count value is generated by performing a second data read operation based on the read voltage at a second read voltage level (step S320), a third cell count value to an (n−1)th cell count value are generated by performing a third to an (n−1)th data read operation based on read voltages at third to (n−1)th read voltage levels, respectively, and n-th cell count value is generated by performing an n-th data read operation based on the read voltage at the n-th read voltage level (step S330).

Figure 9A:
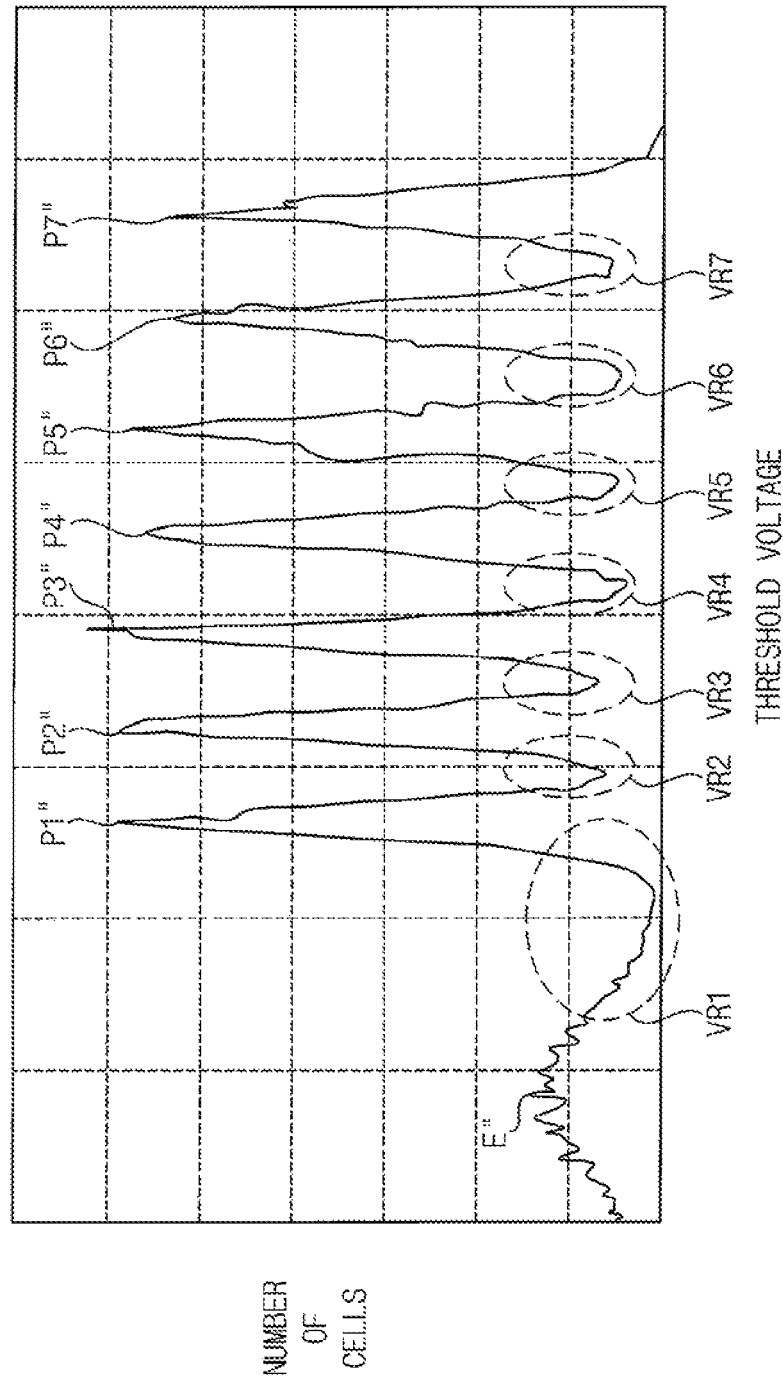
FIGS. 9A and 9B illustrate an operation of FIG. 8.
Figure 9B:
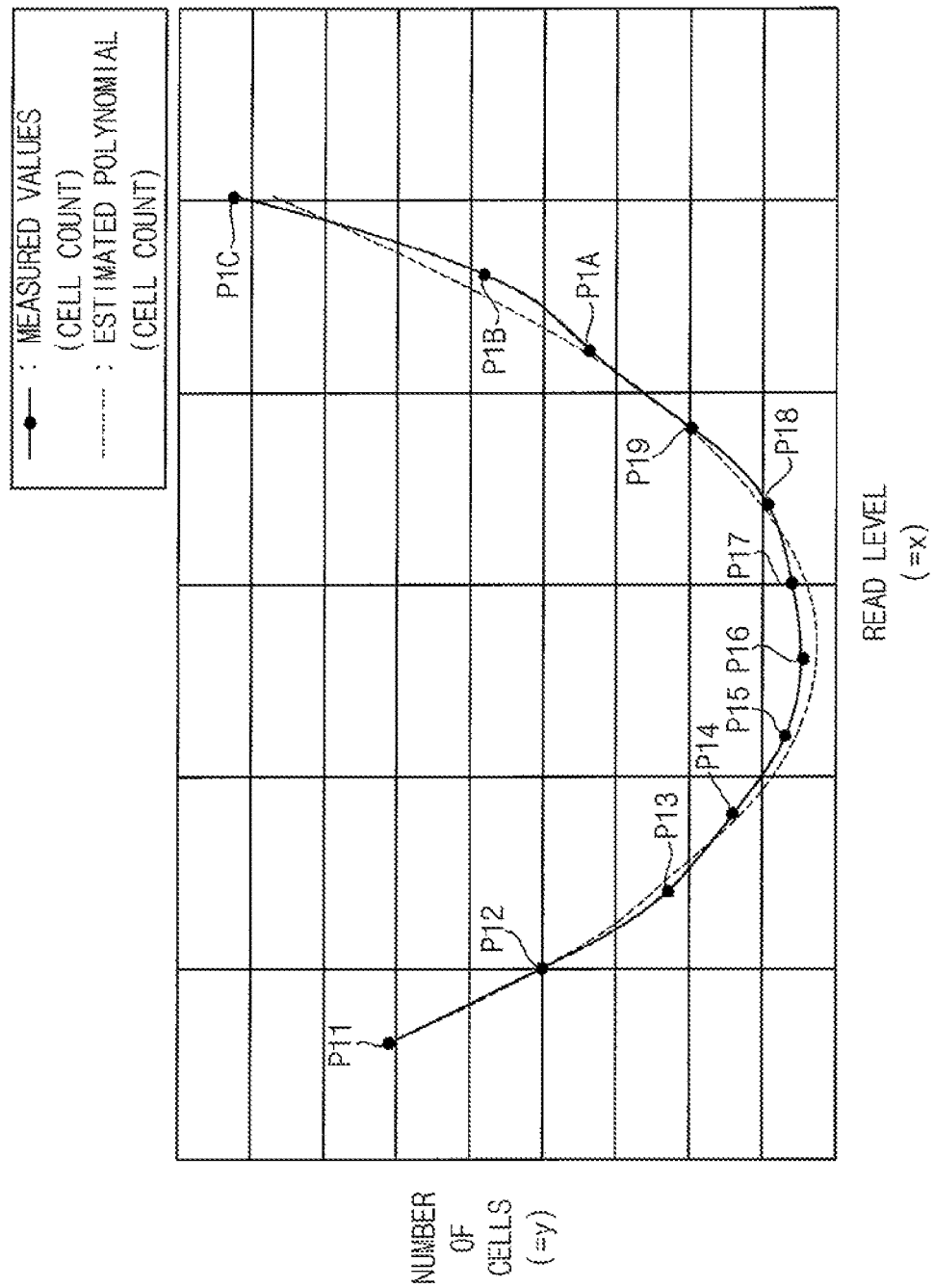

FIGS. 9A and 9B illustrate an operation of FIG. 8.

Referring to FIG. 9A, in some embodiments, a distribution of actually measured threshold voltages of the plurality of memory cells is illustrated based on an example where the plurality of memory cells are TLCs. Descriptions that repeat those presented with regard to FIGS. 7A and 7B may be omitted.

An erase state E" and program states P1", P2", P3", P4", P5", P6" and P7" in FIG. 9A correspond to the erase state E and the program states P1 to P7 in FIG. 7A, respectively. Each memory cell has a threshold voltage that corresponds to one of the erase state E" or the program states P1" to P7". The threshold voltage and/or the distribution of the threshold voltages can change due to a lapse of time and various other factors. Such variation may cause the memory cell states to overlap. Exactly determining or discriminating the states of the memory cells can be challenging, and thus, the read voltage level of the read voltage should be adjusted. A read voltage that has the least bit error rate (BER) is a factor of data integrity.

As illustrated in FIG. 9A, in some embodiments, distribution valleys VR1, VR2, VR3, VR4, VR5, VR6 and VR7 are present that represent overlaps between the states E" and P1" to P7". For example, the distribution valley VR1 represents an overlap between the erase state E and the first program state P1". Curves corresponding to the distribution valleys VR1 to VR7 have minimum points, respectively. If a threshold voltage that corresponds to the minimum point is determined as the read voltage, the data read operation provides the best data integrity.

Referring to FIG. 9B, in some embodiments, an example is illustrated in which an operation of FIG. 8 is performed on one of the distribution valleys VR1 to VR7 in FIG. 9A, such as the distribution valley VR1.

A first voltage-cell count pair to an n-th voltage-cell count pair are formed based on the first to n-th read voltage levels and the first to n-th cell count values obtained by the operation of FIG. 8. For example, of the first to n-th voltage-cell count pairs, a k-th voltage-cell count pair includes a k-th read voltage level and a k-th cell count value, where k is an integer greater than or equal to one and less than or equal to n.

For convenience of description, $x_0, x_1, \ldots, x_{n-1}$ denote the first to n-th read voltage levels, respectively, $y_0, y_1, \ldots, y_{n-1}$ denote the first to n-th cell count values, respectively, and $(x_0, y_0)$, $(x_1, y_1)$, $(x_{n-1}, y_{n-1})$ denote the first to n-th voltage-cell count pairs, respectively. The first to n-th voltage-cell count pairs $(x_0, y_0)$ to $(x_{n-1}, y_{n-1})$ are illustrated as n points on a two-dimensional (2D) plane in which an x-axis represents the read voltage level (or threshold voltage level) and a y-axis represents the number of memory cells, such as cell counts. For example, FIG. 9B illustrates an example where n=12, and twelve points P11, P12, P13, P14, P15, P16, P17, P18, P19, P1A, P1B and P1C are illustrated on a two-dimensional plane.

In addition, in FIG. 9B, a solid line represents a curve that connects the points P11 to P1C that are actually measured by the operation of FIG. 8, and a dotted line represents a parabola of a second-order polynomial or function similar to the solid line. For example, the points P11 to P1C obtained by the operation of FIG. 8 and that correspond to the distribution valleys are estimated or modeled as a second-order polynomial. If an optimal read voltage level of the read voltage is determined by performing a calculation based on the second-order polynomial, the amount of calculation may increase. Thus, according to embodiments, the optimal read voltage level of a read voltage is determined by performing a calculation based on a first-order polynomial, as will be described with reference to FIGS. 10 and 11.

In some embodiments, when selecting the n read voltage levels of the read voltage by step S200 in FIG. 1, an initial read voltage level of the read voltage is used. For example, when the operation of FIG. 8 is performed for the distribution valley VR1, a reference read voltage level of the first read voltage VRD1 in FIG. 7 is determined based on an initial read voltage level of the first read voltage VRD1, and first to n-th read voltage levels of the first read voltage VRD1 are selected based on the reference read voltage level of the first read voltage VRD1.

Figure 10:
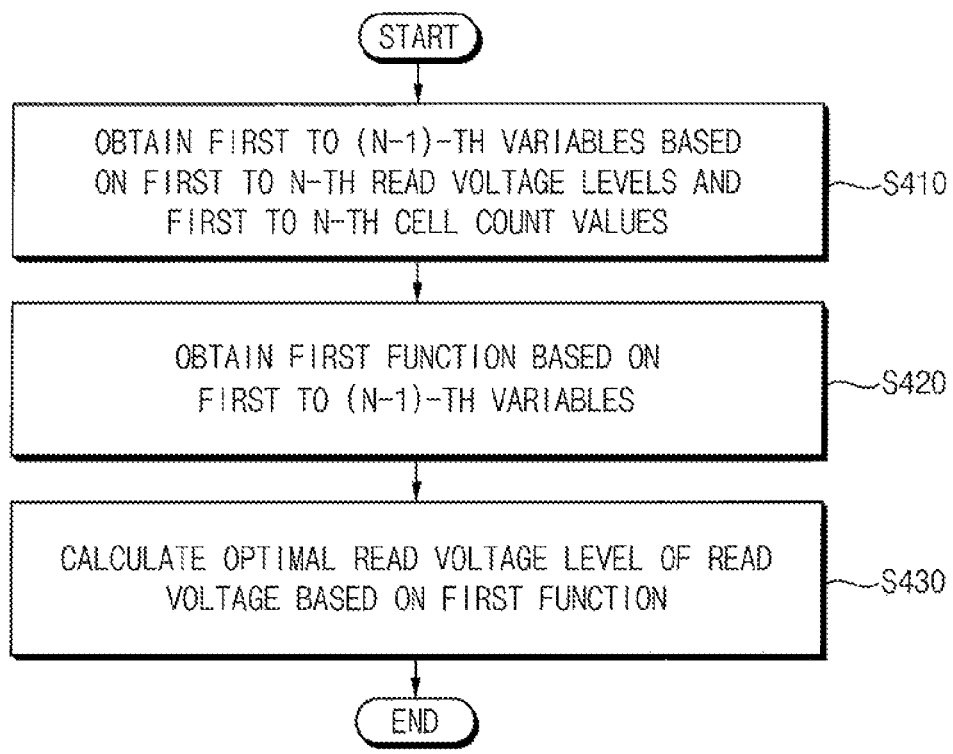
FIG. 10 is a flowchart of a method of determining an optimal read voltage level of a read voltage in FIG. 1.

FIG. 10 is a flowchart of a method of determining an optimal read voltage level of a read voltage in FIG. 1.

Referring to FIGS. 1 and 10, in some embodiments, when determining the optimal read voltage level of the read voltage (step S400), a first variable to an (n−1)-th variable are obtained based on the first to n-th read voltage levels and the first to n-th cell count values (step S410). Each of the first to (n−1)-th variables represents the amount of change in cell count values. For example, each of the first to (n−1)-th variables includes an averaged read voltage level that is obtained based on the first to n-th read voltage levels, and a cell count change value that is obtained based on the first to n-th cell count values.

A first function is obtained based on the first to (n−1)-th variables (step S420). The first function is estimated as a first-order polynomial. The optimal read voltage level of the read voltage is calculated based on the first function (step S430). For example, the first function is obtained by performing a regression analysis based on a first-order polynomial using the first to (n−1)-th variables.

Figure 11:
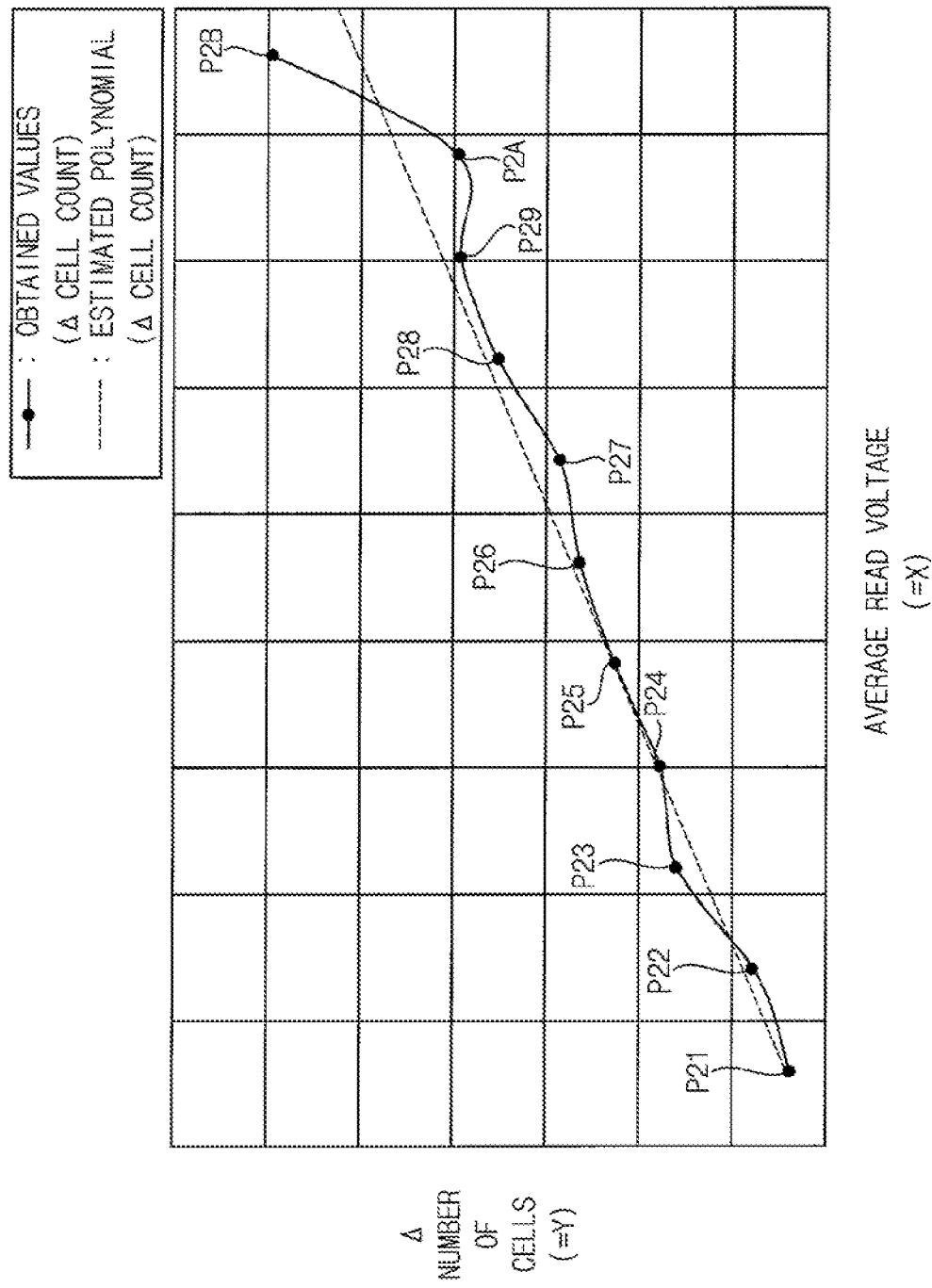
FIG. 11 illustrates an operation of FIG. 10.

FIG. 11 illustrates an operation of FIG. 10.

Referring to FIG. 11, in some embodiments, an example is illustrated in which the operation of FIG. 10 is performed on one of the distribution valleys VR1 to VR7 in FIG. 9A, such as the distribution valley VR1. For example, the operation of FIG. 10 is performed based on the example of FIG. 9B.

Of the first to (n−1)-th variables obtained by step S410 in FIG. 10, an (i+1)-th variable is obtained based on an (i+1)-th voltage-cell count pair and an (i+2)-th voltage-cell count pair of the first to n-th voltage-cell count pairs obtained by the operation of FIG. 8, where i is an integer greater than or equal to zero and less than or equal to (n−2).

For example, each of the first to (n−1)-th variables includes, respectively, one of the first to (n−1)-th averaged read voltage levels and one of the first to (n−1)-th cell count change values, and one variable forms one voltage-cell count change pair. For example, the (i+1)-th variable includes an (i+1)-th averaged read voltage level and an (i+1)-th cell count change value. The (i+1)-th averaged read voltage level is obtained by dividing a sum of an (i+1)-th read voltage level and an (i+2)-th read voltage level by two. The (i+1)-th cell count change value is obtained by subtracting an (i+1)-th cell count value from an (i+2)-th cell count value.

For convenience of description, $x_0, x_1, \ldots, x_{n-1}$ denote the first to n-th read voltage levels, respectively, and $y_0, y_1, y_{n-1}$ denote the first to n-th cell count values, respectively. A first averaged read voltage level and a first cell count change value in the first variable are $(x_0+x_1)/2$ and $y_1-y_0$, respectively. A second averaged read voltage level and a second cell count change value in the second variable are $(x_1+x_2)/2$ and $y_2-y_1$, respectively. An (n−1)-th averaged read voltage level and an (n−1)-th cell count change values in the (n−1)-th variable are $(x_{n-2}+x_{n-1})/2$ and $y_{n-1}-y_{n-2}$, respectively. Letting $(X_i, Y_i)$ denote the (i+1)-th variable, the (i+1)-th averaged read voltage level $X_i$ and the (i+1)-th cell count change value $Y_i$ can be represented as Equation 1 and Equation 2, respectively.

$$X_i=(x_i+x_{i+1})/2 \quad \text{Equation 1}$$

$$Y_i=y_{i+1}-y_i \quad \text{Equation 2}$$

In Equation 1, $x_i$ and $x_{i+1}$ denote the (i+1)-th read voltage level and the (i+2)-th read voltage level, respectively. In Equation 2, $y_i$ and $y_{i+1}$ denote the (i+1)-th cell count value and the (i+2)-th cell count value, respectively.

The first to (n−1)-th variables $(X_0, Y_0), (X_1, Y_1), \ldots, (X_{n-2}, Y_{n-2})$ can be illustrated as (n−1) points on a two-dimensional plane in which an X-axis represents the averaged read voltage level and a Y-axis represents the amount of change in the number of memory cells, such as cell count changes. For example, FIG. 11 illustrates an example where n=12, and eleven points P21, P22, P23, P24, P25, P26, P27, P28, P29, P2A and P2B obtained based on the twelve points P11 to P1C in FIG. 9B are illustrated on a two-dimensional plane.

In addition, in FIG. 11, a solid line represents a curve that connects the points P21 to P2B obtained by step S410 in FIG. 10, and a dotted line represents a straight line of a first-order polynomial or function similar to the solid line. For example, the points P21 to P2B obtained by step S410 in FIG. 10 and that correspond to the cell count changes can be estimated or modeled as a first-order polynomial. For example, the first function obtained by step S420 in FIG. 10 can be defined as Equation 3, and the optimal read voltage level of the read voltage calculated by step S430 in FIG. 10 corresponds to an X-intercept, such as −b/a, of the first function.

$$Y=aX+b \quad \text{Equation 3}$$

When obtaining the first function and the X-intercept of the first function, a relationship between the first to (n−1)-th variables $(X_0, Y_0)$ to $(X_{n-2}, Y_{n-2})$ and a and b in Equation 3 can be represented as Equation 4, and Equation 4 can be represented as Equation 5 and Equation 6.

$$\begin{pmatrix} Y_0 \\ Y_1 \\ \vdots \\ Y_{n-2} \end{pmatrix} \approx \begin{pmatrix} 1 & X_0 \\ 1 & X_1 \\ \vdots & \vdots \\ 1 & X_{n-2} \end{pmatrix} \begin{pmatrix} b \\ a \end{pmatrix} \quad \text{Equation 4}$$

$$y \approx X \cdot a \quad \text{Equation 5}$$

$$y = \begin{pmatrix} Y_0 \\ Y_1 \\ \vdots \\ Y_{n-2} \end{pmatrix}, X = \begin{pmatrix} 1 & X_0 \\ 1 & X_1 \\ \vdots & \vdots \\ 1 & X_{n-2} \end{pmatrix}, a = \begin{pmatrix} b \\ a \end{pmatrix} \quad \text{Equation 6}$$

Based on a regression analysis, Equation 7 can be satisfied. Based on Equation 7, a and b in Equation 3 can be calculated as Equation 8.

$$a = (X^T X)^{-1} X^T y \quad \text{Equation 7}$$

$$\begin{pmatrix} b \\ a \end{pmatrix} = \frac{1}{\det(X^T X)} \begin{pmatrix} \sum X_i^2 & -\sum X_i \\ -\sum X_i & n-1 \end{pmatrix} \begin{pmatrix} \sum Y_i \\ \sum X_i Y_i \end{pmatrix} \quad \text{Equation 8}$$

Since the X-intercept of the first function that corresponds to the optimal read voltage level of the read voltage is −b/a, and since the X-intercept is obtained only with a ratio of a and b without calculating a and b, the calculation of a determinant in Equation 8 may be unnecessary. Therefore, the X-intercept can be obtained based on Equation 9.

$$-\frac{b}{a} = \frac{\sum X_i^2 \sum Y_i - \sum X_i \sum X_i Y_i}{\sum X_i \sum Y_i - (n-1) \sum X_i Y_i} \quad \text{Equation 9}$$

If a regression analysis based on a second-order polynomial is performed, a 3×3 matrix is used, the amount of calculations increases, and time for determining the optimal read voltage level increases. In contrast, when a regression analysis based on the first-order polynomial is performed according to embodiments, a 2×2 matrix is used, the amount of calculations decreases, and thus the optimal read voltage level can be determined quickly and accurately.

Figure 12:
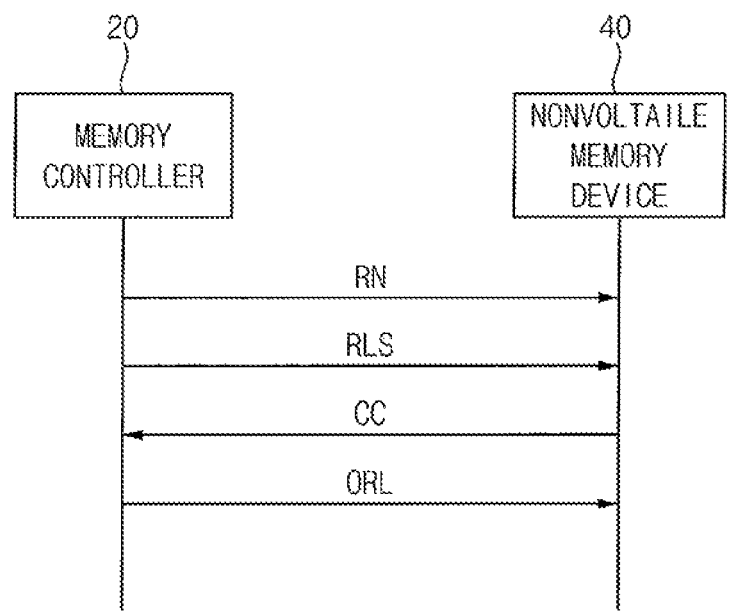
FIG. 12 illustrates an operation of a memory system of FIG. 2.

FIG. 12 illustrates an operation of the memory system of FIG. 2.

Referring to FIGS. 2 and 12, in some embodiments, when the memory system 10 performs a method of FIG. 1, the memory controller 20 performs steps S100 and S200, and transmits the read number signal RN and the read voltage level selection signal RLS to the nonvolatile memory device 40. The nonvolatile memory device 40 performs step S300, and transmits the cell count signal CC to the memory controller 20. The memory controller 20 performs step S400, and transmits the optimal read voltage level signal ORL to the nonvolatile memory device 40.

Figure 13:
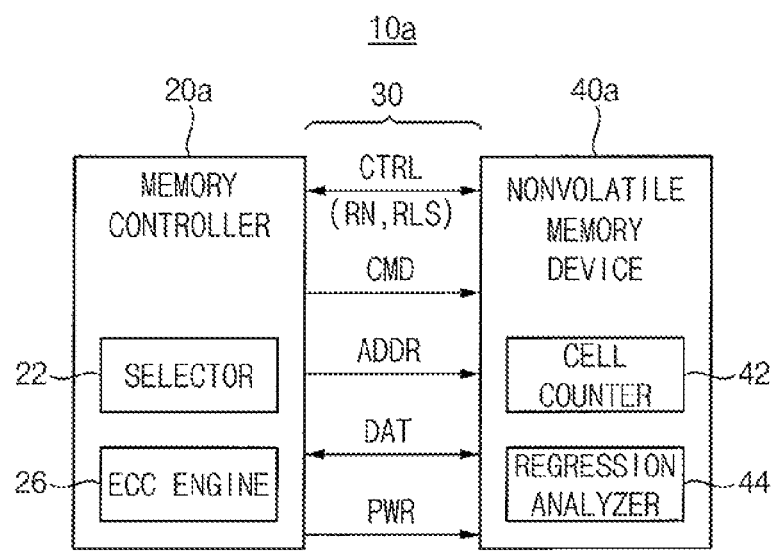
FIG. 13 is a block diagram of a memory system that includes a nonvolatile memory device according to embodiments.

FIG. 13 is a block diagram of a memory system that includes a nonvolatile memory device according to embodiments. Descriptions that repeat those presented with regard to FIG. 2 may be omitted.

Referring to FIG. 13, in some embodiments, a memory system 10a includes a memory controller 20a and a nonvolatile memory device 40a. The memory system 10a further includes a plurality of signal lines 30.

The memory system 10a is substantially the same as the memory system 10 of FIG. 2, except that a regression analyzer 44 is included in the nonvolatile memory device 40a rather than the memory controller 20a. The regression analyzer 44 is substantially the same as the regression analyzer 24 in FIG. 2. For example, the regression analyzer 44 may be disposed inside or outside a control circuit, such as the control circuit 160 in FIG. 3, in the nonvolatile memory device 40a.

Figure 14:
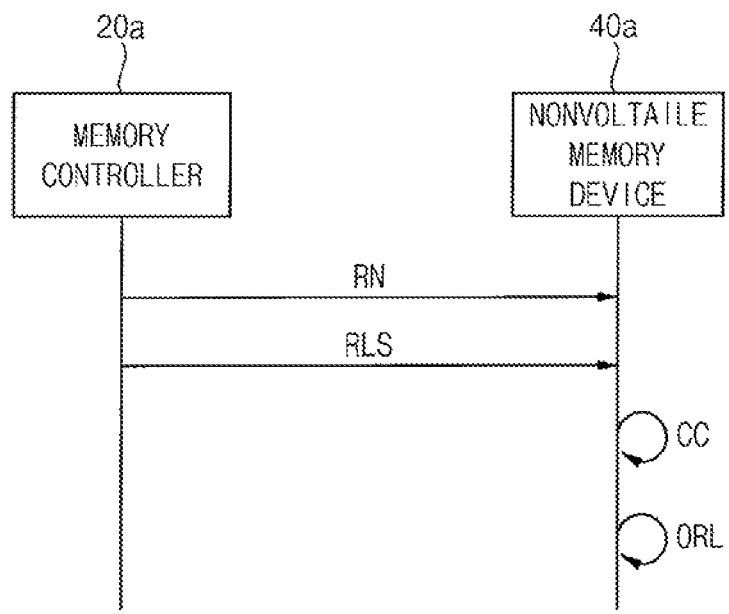
FIG. 14 illustrates an operation of a memory system of FIG. 13.

FIG. 14 illustrates an operation of a memory system of FIG. 13. Descriptions that repeat those presented with regard to FIG. 12 may be omitted.

Referring to FIGS. 13 and 14, in some embodiments, when the memory system 10a performs a method of FIG. 1, the memory controller 20a performs steps S100 and S200. The nonvolatile memory device 40a performs steps S300 and S400, and generates the cell count signal CC and the optimal read voltage level signal ORL.

Figure 15:
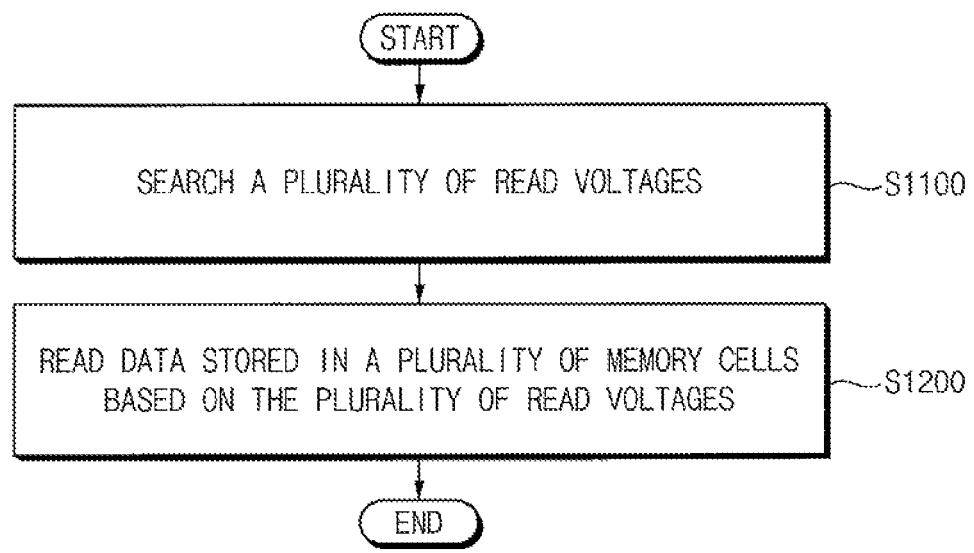
FIG. 15 is a flowchart of a method of reading data from a nonvolatile memory device according to embodiments.

FIG. 15 is a flowchart of a method of reading data from a nonvolatile memory device according to embodiments.

Referring to FIG. 15, in some embodiments, a method of reading data according to embodiments is performed by a nonvolatile memory device that includes a plurality of memory cells and a memory controller that controls an operation of the nonvolatile memory device. The plurality of memory cells include a plurality of states. For example, the nonvolatile memory device, the memory controller and a memory system that includes thereof are implemented as described with reference to FIGS. 2 through 6, and the plurality of states are implemented as described with reference to FIG. 7.

In a method of reading data from a nonvolatile memory device according to embodiments, a plurality of read voltages used to distinguish the plurality of states are searched (step S1100). Step S1100 is performed based on a method of searching the read voltage of a nonvolatile memory device according to embodiments described with reference to FIGS. 1 through 14. For example, a method of searching the read voltage of a nonvolatile memory device according to embodiments is applied to an operation of searching each of the plurality of read voltages. Step S1100 will be described in detail with reference to FIG. 16.

Data stored in the plurality of memory cells are read or retrieved based on the plurality of read voltages (step S1200). As a result of performing step S1100, each of the plurality of read voltages has an optimal read voltage level, and thus a bit error rate (BER) is reduced and the read performance is increased.

Figure 16:
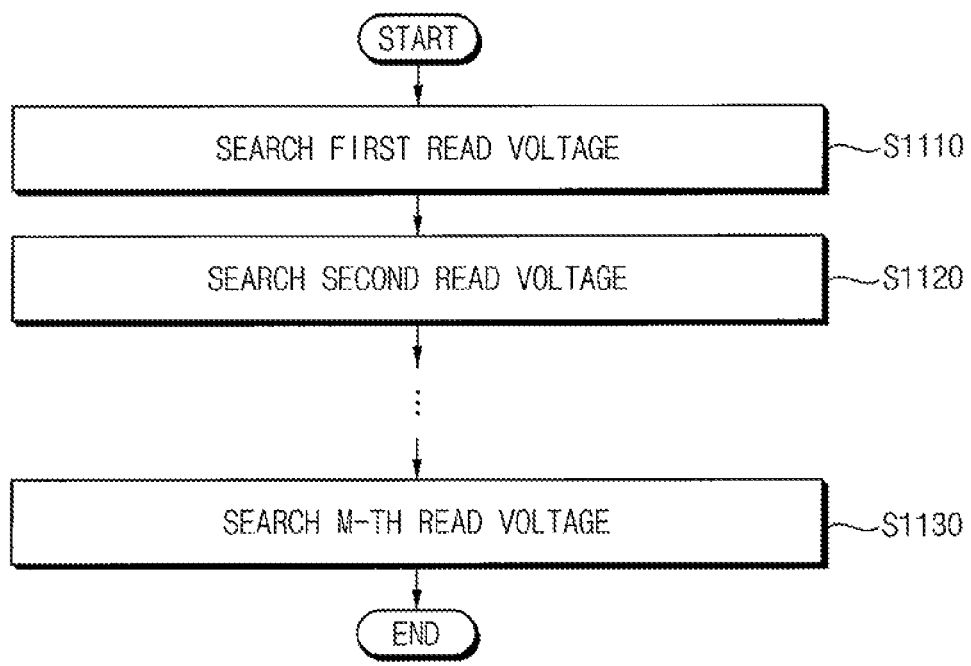
FIG. 16 is a flowchart of a method of searching a plurality of read voltages in FIG. 15.

FIG. 16 is a flowchart of a method of searching a plurality of read voltages in FIG. 15.

Referring to FIGS. 15 and 16, in some embodiments, when searching the plurality of read voltages (step S1100), the plurality of states includes a first state to an (m+1)-th state, where m is an integer greater than or equal to two, and the plurality of read voltages include a first read voltage to an m-th read voltage that can distinguish the first to (m+1)-th states.

The first read voltage that distinguishes the first state and a second state is searched (step S1110), a second read voltage that distinguishes the second state and a third state is searched (step S1120), and the m-th read voltage that distinguishes between an m-th state and the (m+1)-th state is searched (step S1130). Each of steps S1110, S1120 and S1130 is performed based on a method of searching the read voltage of FIG. 1.

For example, in step S1110, a number n is determined, n first read voltage levels are selected, n first cell count values are generated, and a first optimal read voltage level of the first read voltage is determined. Similarly, in step S1120, n second read voltage levels are selected, n second cell count values are generated, and a second optimal read voltage level of the second read voltage is determined. In step S1130, n m-th read voltage levels are selected, n m-th cell count values are generated, and an m-th optimal read voltage level of the m-th read voltage is determined. In steps S1120 and S1130, an operation of determining the number n is omitted.

Figure 17:
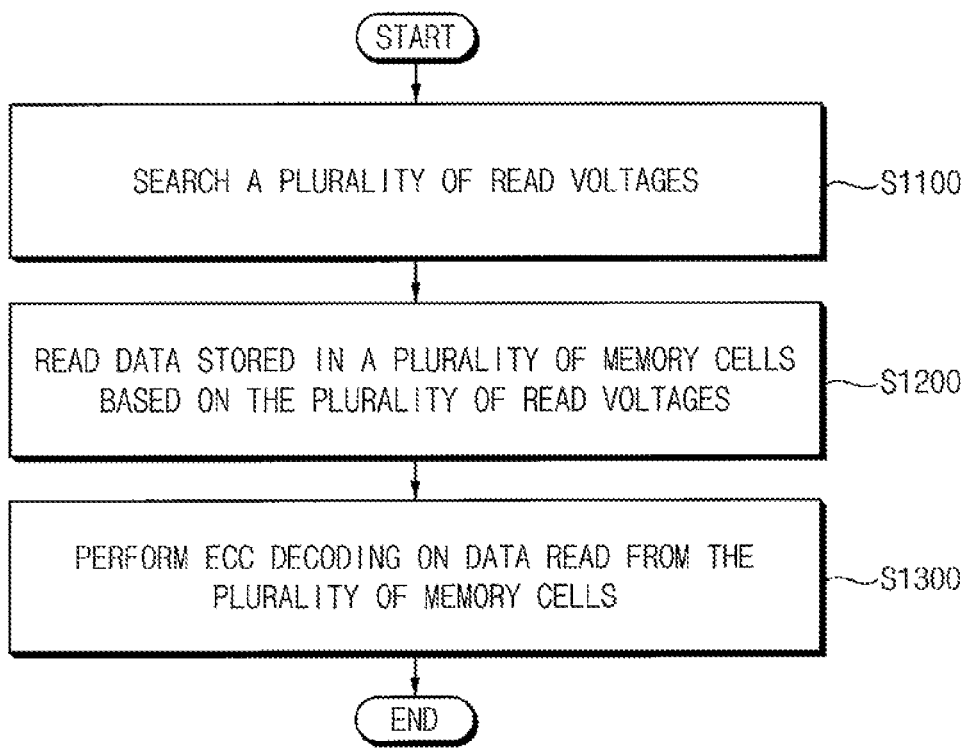
FIG. 17 is a flowchart of a method of reading data from a nonvolatile memory device according to embodiments.

FIG. 17 is a flowchart of a method of reading data from a nonvolatile memory device according to embodiments. Descriptions that repeat those presented with regard to FIG. 15 may be omitted.

Referring to FIG. 17, in some embodiments, in a method of reading data from a nonvolatile memory device according to embodiments, steps S1100 and S1200 are substantially the same as steps S1100 and S1200 in FIG. 15, respectively.

An error correction code (ECC) decoding is performed on the data that is read from the plurality of memory cells as a result of performing step S1200 (step S1300). For example, a method of reading data of FIG. 17 is associated with or related to a prevention code, and in particular, a data recovery read operation. For example, in step S1300, the presence of errors, the number of bit errors, etc. are detected, and error correction is performed when the detected errors are correctable.

Figure 18:
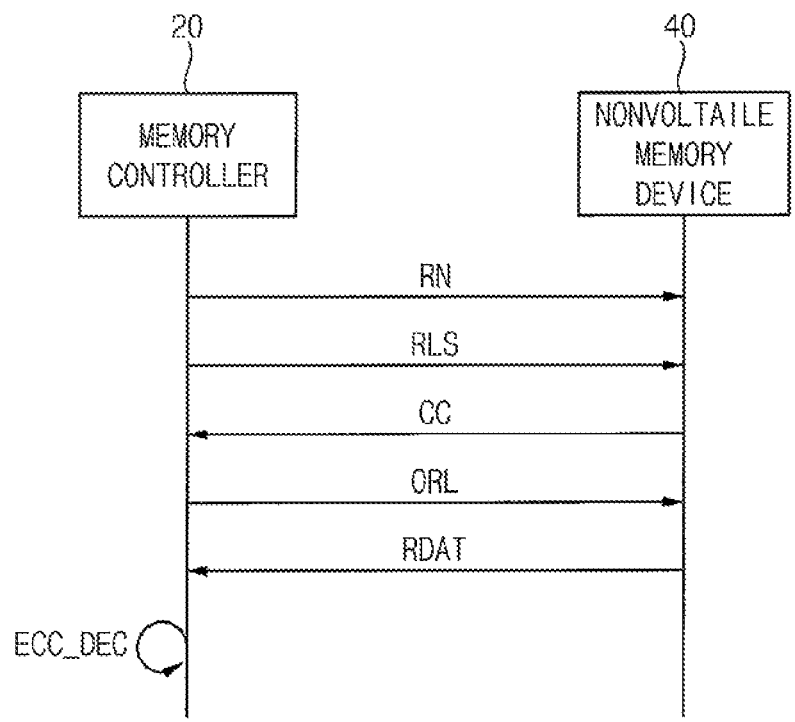
FIGS. 18 and 19 illustrate an operation of a memory systems of FIGS. 2 and 13.
Figure 19:
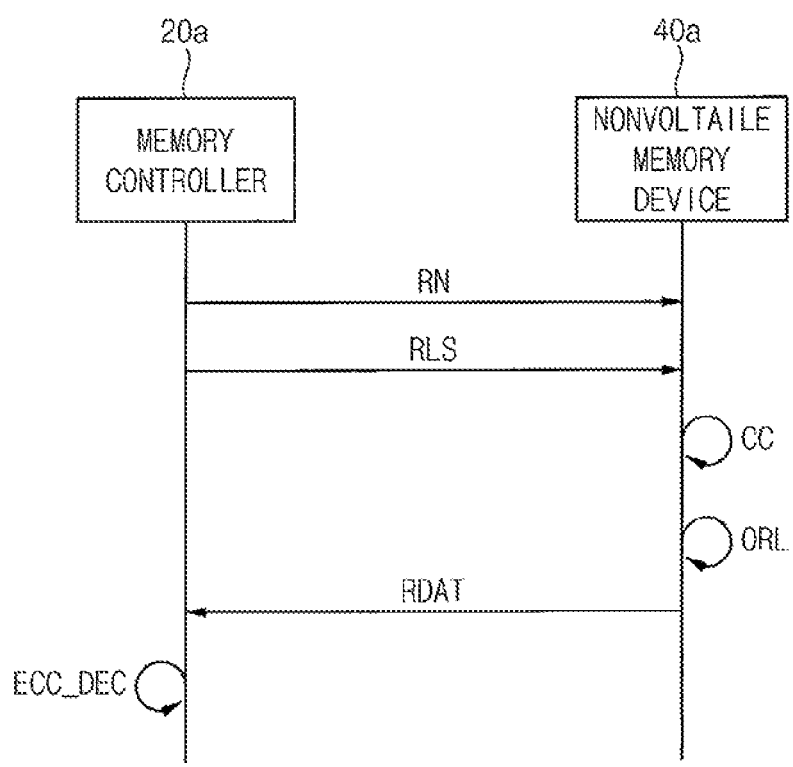

FIGS. 18 and 19 illustrate an operation of memory systems of FIGS. 2 and 13. Descriptions that repeat those presented with regard to FIGS. 12 and 14 may be omitted.

Referring to FIGS. 2 and 18, in some embodiments, when the memory system 10 performs a method of FIG. 17, the memory controller 20 performs steps S100 and S200, the nonvolatile memory device 40 performs step S300, and the memory controller 20 performs step S400. The nonvolatile memory device 40 performs step S1200, and transmits read data RDAT to the memory controller 20. The memory controller 20 performs an ECC decoding ECC_DEC of step S1300.

Referring to FIGS. 13 and 19, in some embodiments, when the memory system 10a performs a method of FIG. 17, the memory controller 20a performs steps S100 and S200, and the nonvolatile memory device 40a performs steps S300 and S400. As described with reference to FIG. 18, the nonvolatile memory device 40a performs step S1200, and the memory controller 20 performs step S1300.

Figure 20:
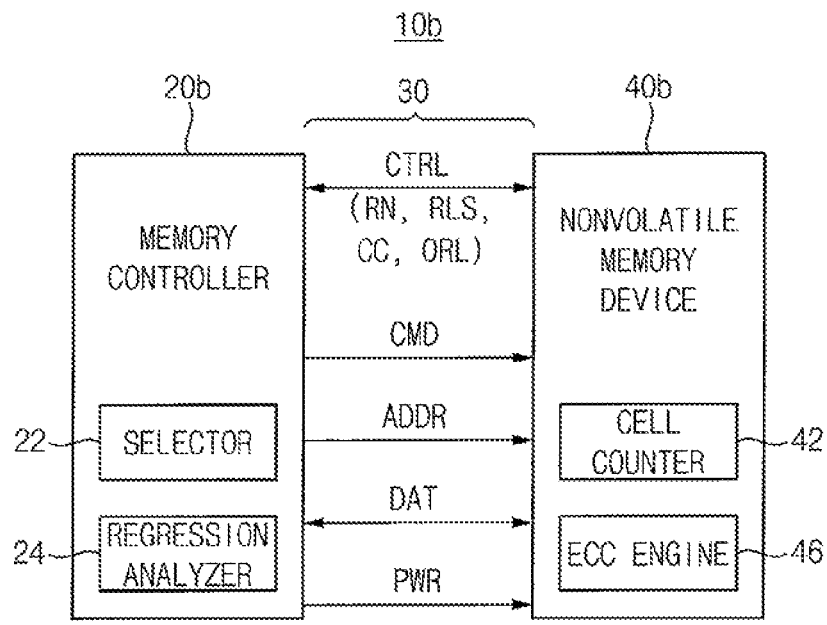
FIG. 20 is a block diagram of a memory system that includes a nonvolatile memory device according to embodiments.

FIG. 20 is a block diagram of a memory system that includes a nonvolatile memory device according to embodiments. Descriptions that repeat those presented with regard to FIG. 2 may be omitted.

Referring to FIG. 20, in some embodiments, a memory system 10b includes a memory controller 20b and a nonvolatile memory device 40b. The memory system 10b further includes a plurality of signal lines 30.

The memory system 10b is substantially the same as the memory system 10 of FIG. 2, except that an ECC engine 46 is included in the nonvolatile memory device 40b rather than the memory controller 20b. The ECC engine 46 is substantially the same as the ECC engine 26 in FIG. 2. For example, the ECC engine 46 may be disposed inside or outside a control circuit, such as the control circuit 160 in FIG. 3, in the nonvolatile memory device 40b.

Figure 21:
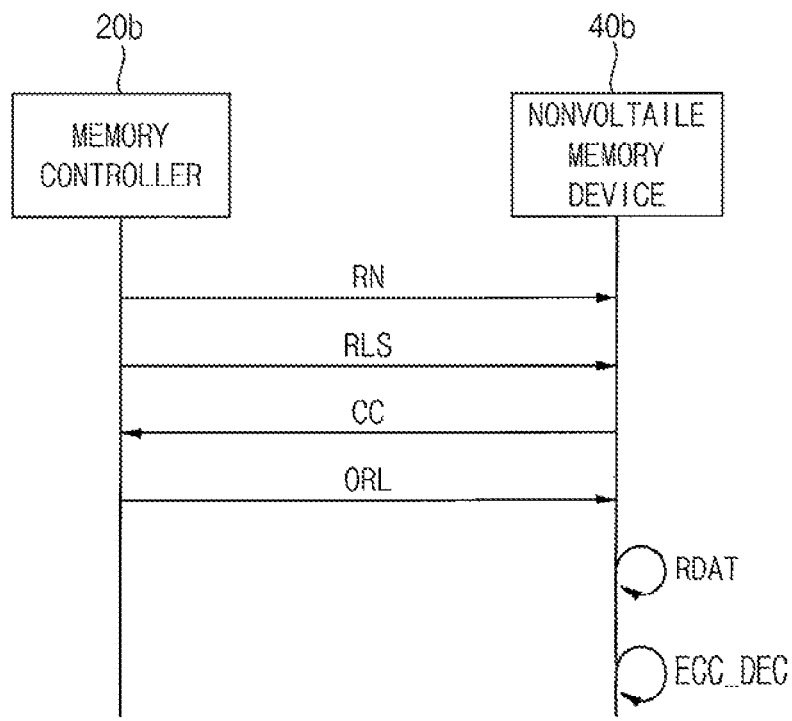
FIG. 21 illustrates an operation of a memory system of FIG. 20.

FIG. 21 illustrates an operation of a memory system of FIG. 20. Descriptions that repeat those presented with regard to FIG. 18 may be omitted.

Referring to FIGS. 20 and 21, in some embodiments, when the memory system 10b performs a method of FIG. 17, the memory controller 20b performs steps S100 and S200, the nonvolatile memory device 40b performs step S300, the memory controller 20b performs step S400, and the nonvolatile memory device 40b performs steps S1200 and S1300.

Figure 22:
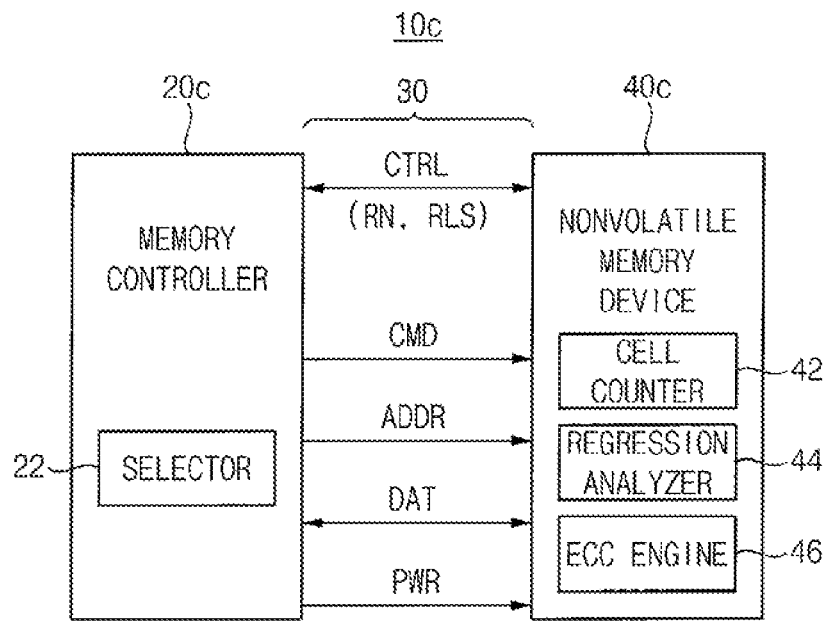
FIG. 22 is a block diagram of a memory system that includes a nonvolatile memory device according to embodiments.

FIG. 22 is a block diagram of a memory system that includes a nonvolatile memory device according to embodiments. Descriptions that repeat those presented with regard to FIGS. 13 and 20 may be omitted.

Referring to FIG. 22, in some embodiments, a memory system 10c includes a memory controller 20c and a nonvolatile memory device 40c. The memory system 10c further includes a plurality of signal lines 30.

The memory system 10c is substantially the same as a memory system 10a of FIG. 13, except that an ECC engine 46 is included in the nonvolatile memory device 40c than the memory controller 20c. The ECC engine 46 is substantially the same as the ECC engine 46 in FIG. 20.

Figure 23:
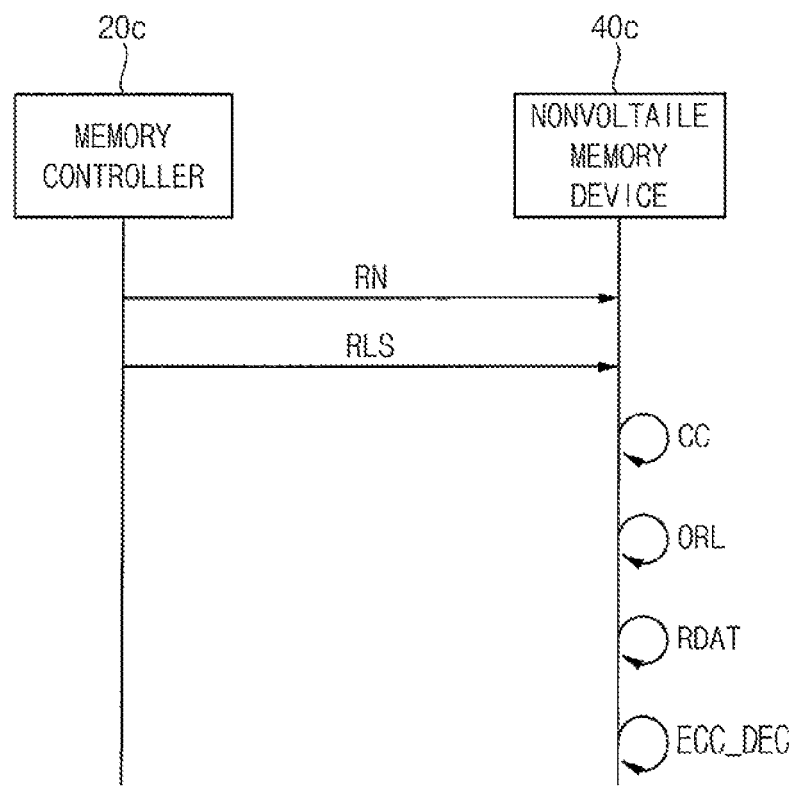
FIG. 23 illustrates an operation of a memory system of FIG. 22.

FIG. 23 illustrates an operation of a memory system of FIG. 22. Descriptions that repeat those presented with regard to FIGS. 19 and 21 may be omitted.

Referring to FIGS. 22 and 23, in some embodiments, when the memory system 10c performs a method of FIG. 17, the memory controller 20c performs steps S100 and S200, the nonvolatile memory device 40c performs steps S300 and S400, and the nonvolatile memory device 40c performs steps S1200 and S1300.

As will be appreciated by those skilled in the art, embodiments of the inventive concept can be embodied as a system, a method, a computer program product, and/or a computer program product embodied in one or more computer readable medium(s) that hayed computer readable program code embodied thereon. The computer readable program code is provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 24:
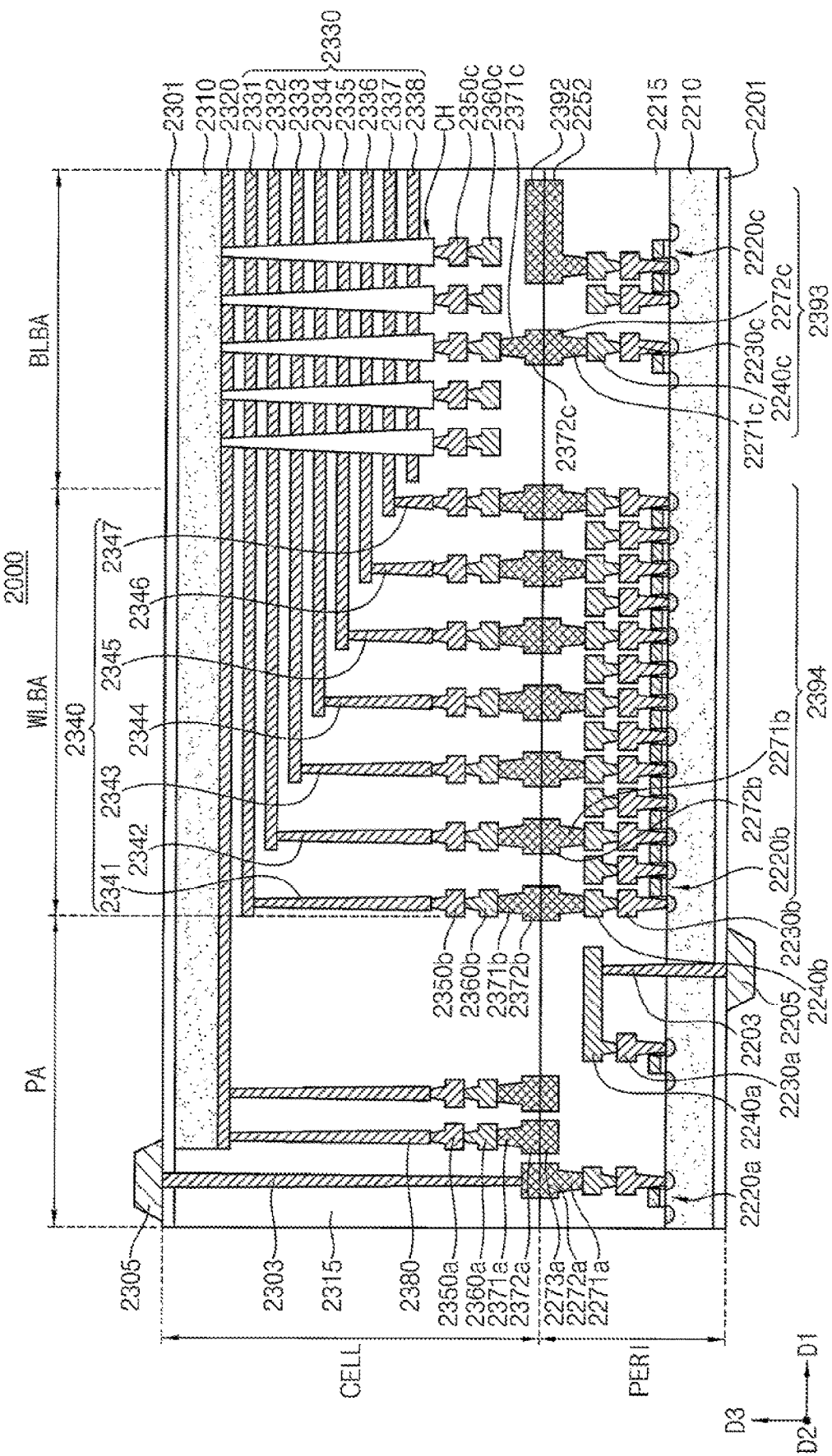
FIG. 24 is a cross-sectional view of a nonvolatile memory device according to embodiments.

FIG. 24 is a cross-sectional view of a nonvolatile memory device according to embodiments.

Referring to FIG. 24, in some embodiments, a nonvolatile memory device or a memory device 2000 has a chip-to-chip (C2C) structure. A C2C structure is formed by manufacturing an upper chip that includes a memory cell region or a cell region CELL on a first wafer, manufacturing a lower chip that includes a peripheral circuit region PERI on a second wafer separate from the first wafer, and bonding the upper chip and the lower chip to each other. The bonding process includes a method of electrically connecting a bonding metal formed on an uppermost metal layer of the upper chip and a bonding metal formed on an uppermost metal layer of the lower chip. For example, the bonding metals include copper (Cu) used in a Cu-to-Cu bonding. However, embodiments are not necessarily limited thereto. For example, in some embodiments, the bonding metals include aluminum (Al) or tungsten (W).

Each of the peripheral circuit region PERI and the cell region CELL of the memory device 2000 includes an external pad bonding area PA, a wordline bonding area WLBA, and a bitline bonding area BLBA.

The peripheral circuit region PERI include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an embodiment, the first metal layers 2230a, 2230b, and 2230c are formed of tungsten, which has a relatively high electrical resistivity, and the second metal layers 2240a, 2240b, and 2240c are formed of copper, which has a relatively low electrical resistivity.

In an embodiment illustrated in FIG. 24, although only the first metal layers 2230a, 2230b, and 2230c and the second metal layers 2240a, 2240b, and 2240c are shown and described, embodiments are not necessarily limited thereto, and other embodiments, one or more additional metal layers are further formed on the second metal layers 2240a, 2240b, and 2240c. At least a portion of the one or more additional metal layers formed on the second metal layers 2240a, 2240b, and 2240c are formed of aluminum or a similar metal that has a lower electrical resistivity than the copper used to form the second metal layers 2240a, 2240b, and 2240c.

The interlayer insulating layer 2215 is disposed on the first substrate 2210 and covers the plurality of circuit elements 2220a, 2220b, and 2220c, the first metal layers 2230a, 2230b, and 2230c, and the second metal layers 2240a, 2240b, and 2240c. The interlayer insulating layer 2215 includes an insulating material such as silicon oxide or silicon nitride, etc.

Lower bonding metals 2271b and 2272b are formed on the second metal layer 2240b in the wordline bonding area WLBA. In the wordline bonding area WLBA, the lower bonding metals 2271b and 2272b in the peripheral circuit region PERI are electrically bonded to upper bonding metals 2371b and 2372b of the cell region CELL. The lower bonding metals 2271b and 2272b and the upper bonding metals 2371b and 2372b are formed of at least one of aluminum, copper, or tungsten, etc. Further, the upper bonding metals 2371b and 2372b in the cell region CELL are referred as first metal pads and the lower bonding metals 2271b and 2272b in the peripheral circuit region PERI are referred as second metal pads.

The cell region CELL includes at least one memory block. The cell region CELL includes a second substrate 2310 and a common source line 2320. On the second substrate 2310, a plurality of wordlines 2330 that include wordlines 2331, 2332, 2333, 2334, 2335, 2336, 2337, and 2338 are stacked in a third direction D3, such as a Z-axis direction, perpendicular to a lower surface of the second substrate 2310. At least one string selection line and at least one ground selection line is disposed on and below the plurality of wordlines 2330, respectively, and the plurality of wordlines 2330 are disposed between the at least one string selection line and the at least one ground selection line.

In the bitline bonding area BLBA, a channel structure CH extends in the third direction D3, perpendicular to the lower surface of the second substrate 2310, and penetrates through the plurality of wordlines 2330, the at least one string selection line, and the at least one ground selection line. The channel structure CH includes a data storage layer, a channel layer, a buried insulating layer, etc., and the channel layer is electrically connected to a first metal layer 2350c and a second metal layer 2360c. For example, the first metal layer 2350c is a bitline contact, and the second metal layer 2360c is a bitline. In an embodiment, the bitline 2360c extends in a second direction D2, such as a Y-axis direction, parallel to the lower surface of the second substrate 2310.

In an embodiment illustrated in FIG. 24, an area in which the channel structure CH, the bitline 2360c, etc., are disposed is referred to as the bitline bonding area BLBA. In the bitline bonding area BLBA, the bitline 2360c is electrically connected to the circuit elements 2220c that are part of a page buffer 2393 in the peripheral circuit region PERI. The bitline 2360c is connected to upper bonding metals 2371c and 2372c in the cell region CELL, and the upper bonding metals 2371c and 2372c are connected to lower bonding metals 2271c and 2272c connected to the circuit elements 2220c of the page buffer 2393.

In the wordline bonding area WLBA, the plurality of wordlines 2330 extend in a first direction D1, such as, an X-axis direction, parallel to the lower surface of the second substrate 2310 and perpendicular to the second direction D2, and are connected to a plurality of cell contact plugs 2340 that include 2341, 2342, 2343, 2344, 2345, 2346, and 2347. The plurality of wordlines 2330 and the plurality of cell contact plugs 2340 are connected to each other in pads provided by at least a portion of the plurality of wordlines 2330 that extend different distances in the first direction D1. A first metal layer 2350b and a second metal layer 2360b are sequentially connected to a lower portion of the plurality of cell contact plugs 2340. The plurality of cell contact plugs 2340 are connected to the peripheral circuit region PERI by the upper bonding metals 2371b and 2372b of the cell region CELL and the lower bonding metals 2271b and 2272b of the peripheral circuit region PERI in the wordline bonding area WLBA.

The plurality of cell contact plugs 2340 are electrically connected to the circuit elements 2220b that are part of a row decoder 2394 in the peripheral circuit region PERI. In an embodiment, operating voltages of the circuit elements 2220b of the row decoder 2394 differ from operating voltages of the circuit elements 2220c of the page buffer 2393. For example, operating voltages of the circuit elements 2220c of the page buffer 2393 are greater than operating voltages of the circuit elements 2220b of the row decoder 2394.

A common source line contact plug 2380 is disposed in the external pad bonding area PA. The common source line contact plug 2380 is formed of a conductive material such as a metal, a metal compound or polysilicon, etc., and is electrically connected to the common source line 2320. A first metal layer 2350a and a second metal layer 2360a are sequentially stacked on a lower portion of the common source line contact plug 2380. For example, an area in which the common source line contact plug 2380, the first metal layer 2350a, and the second metal layer 2360a are disposed is referred to as the external pad bonding area PA.

Input/output pads 2205 and 2305 are disposed in the external pad bonding area PA. A lower insulating film 2201 that covering a lower surface of the first substrate 2210 is formed below the first substrate 2210, and a first input/output pad 2205 is formed on the lower insulating film 2201. The first input/output pad 2205 is connected to at least one of the plurality of circuit elements 2220a, 2220b, and 2220c disposed in the peripheral circuit region PERI through a first input/output contact plug 2203, and is separated from the first substrate 2210 by the lower insulating film 2201. In addition, a side insulating film is disposed between the first input/output contact plug 2203 and the first substrate 2210 that electrically separates the first input/output contact plug 2203 and the first substrate 2210.

An upper insulating film 2301 that covers the upper surface of the second substrate 2310 is formed on the second substrate 2310, and a second input/output pad 2305 is disposed on the upper insulating layer 2301. The second input/output pad 2305 is connected to at least one of the plurality of circuit elements 2220a, 2220b, and 2220c disposed in the peripheral circuit region PERI through a second input/output contact plug 2303. In the embodiment, the second input/output pad 2305 is electrically connected to a circuit element 2220a.

According to embodiments, the second substrate 2310 and the common source line 2320 are not disposed in an area in which the second input/output contact plug 2303 is disposed. In addition, the second input/output pad 2305 does not overlap the wordlines 2330 in the third direction D3. The second input/output contact plug 2303 is separated from the second substrate 2310 in the first direction D1, is perpendicular to the upper surface of the second substrate 2310, and penetrates through the interlayer insulating layer 2315 of the cell region CELL to be connected to the second input/output pad 2305.

According to embodiments, the first input/output pad 2205 and the second input/output pad 2305 are selectively formed. For example, the memory device 2000 may include only the first input/output pad 2205 disposed on the first substrate 2210 or the second input/output pad 2305 disposed on the second substrate 2310. Alternatively, the memory device 200 includes both the first input/output pad 2205 and the second input/output pad 2305.

A dummy metal pattern may be disposed on an uppermost metal layer, or the uppermost metal layer may be absent, in each of the external pad bonding area PA and the bitline bonding area BLBA, respectively in the cell region CELL and the peripheral circuit region PERI.

In the external pad bonding area PA, the memory device 2000 includes a lower metal pattern 2273a that corresponds to an upper metal pattern 2372a formed in an lowermost metal layer of the cell region CELL. The lower metal pattern 2273a has the same cross-sectional shape as the upper metal pattern 2372a of the cell region CELL so as to be connected to each other in an uppermost metal layer of the peripheral circuit region PERI. In the peripheral circuit region PERI, the lower metal pattern 2273a in the uppermost metal layer of the peripheral circuit region PERI is not connected to a contact. The upper metal pattern 2372a that corresponds to the lower metal pattern 2273a is formed in an uppermost metal layer of the peripheral circuit region PERI. The upper metal pattern 2372a is formed in a lowermost metal layer of the cell region CELL and has the same shape as a lower metal pattern 2273a of the peripheral circuit region PERI.

The lower bonding metals 2271b and 2272b are formed on the second metal layer 2240b in the wordline bonding area WLBA. In the wordline bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bitline bonding area BLBA, an upper metal pattern 2392 formed in an lowermost metal layer of the cell region CELL. The upper metal pattern 2392 corresponds to a lower metal pattern 2252 formed in the uppermost metal layer of the peripheral circuit region PERI, and has the same cross-sectional shape as the lower metal pattern 2252 of the peripheral circuit region PERI. No contact is formed on the upper metal pattern 2392 in the lowermost metal layer of the cell region CELL.

In an embodiment, a metal pattern is formed in an uppermost metal layer in one of the cell regions CELL and the peripheral circuit region PERI, and a reinforcement metal pattern that corresponds thereto and that has the same cross-sectional shape is formed in an uppermost metal layer in another one of the cell regions CELL and the peripheral circuit region PERI. No contact is formed on the reinforcement metal pattern.

The memory device 2000 performs a method of searching the read voltage of a nonvolatile memory device according to embodiments and/or a method of reading data from a nonvolatile memory device according to embodiments.

Figure 25:
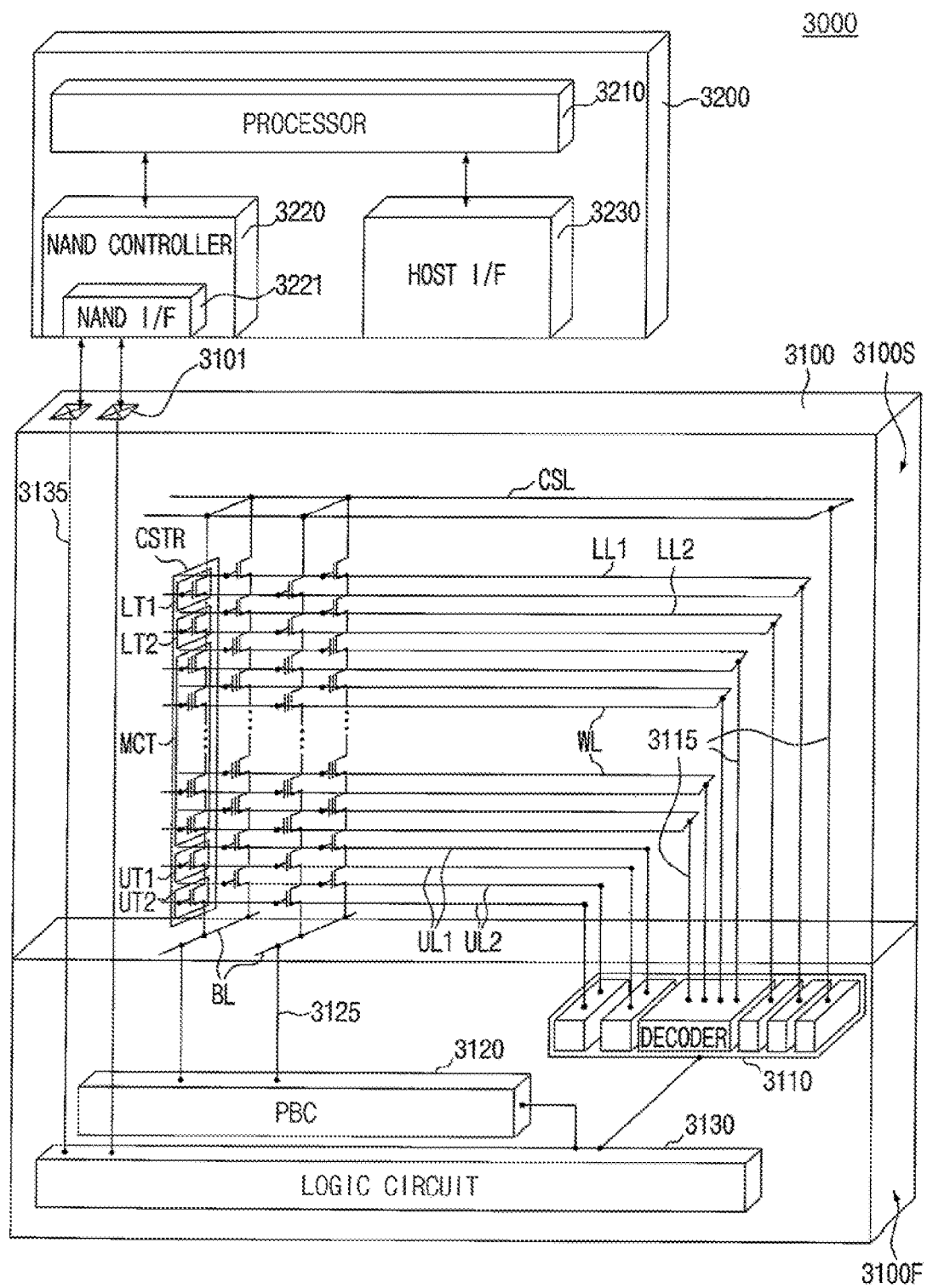
FIG. 25 is a block diagram of an electronic system that includes a nonvolatile memory device according to embodiments.

FIG. 25 is a block diagram of an electronic system that includes a nonvolatile memory device according to embodiments.

Referring to FIG. 25, in some embodiments, an electronic system 3000 include a semiconductor device 3100 and a controller 3200 electrically connected thereto. The electronic system 3000 may be a storage device that includes one or a plurality of semiconductor devices 3100 or an electronic device that includes the storage device. For example, the electronic system 3000 may be a solid state drive (SSD) device, a universal serial bus (USB), a computing system, a medical device, and/or a communication device that includes one or a plurality of semiconductor devices 3100.

In an embodiment, the semiconductor device 3100 is a memory device, such as a nonvolatile memory device according to embodiments described with reference to FIG.

3. The semiconductor device 3100 includes a first structure 3100F and a second structure 3100S on the first structure 3100F. The first structure 3100F is a peripheral circuit structure that includes a decoder circuit 3110, a page buffer circuit 3120, and a logic circuit 3130. The second structure 3100S is a memory cell structure that includes bitlines BL, a common source line CSL, wordlines WL, first and second upper gate lines UL1 and UL2, first and second lower gate lines LL1 and LL2, and memory cell strings CSTR between the bitlines BL and the common source line CSL.

In the second structure 3100S, each of the memory cell strings CSTR may include lower transistors LT1 and LT2 adjacent to the common source line CSL, upper transistors UT1 and UT2 adjacent to the bitlines BL, and a plurality of memory cell transistors MCT between the lower transistors LT1 and LT2 and the upper transistors UT1 and UT2.

In the first structure 3100F, the decoder circuit 3110, the page buffer circuit 3120 and the logic circuit 3130 correspond to the address decoder 120, the page buffer circuit 130 and the control circuit 160 of FIG. 3, respectively.

The common source line CSL, the first and second lower gate lines LL1 and LL2, the wordlines WL, and the first and second upper gate lines UL1 and UL2 are electrically connected to the decoder circuit 3110 through first connection wirings 3115 that extend to the second structure 3110S from the first structure 3100F. The bitlines BL are electrically connected to the page buffer circuit 3120 through second connection wirings 3125 that extend to the second structure 3100S from the first structure 3100F. Input/output pads 3101 are electrically connected to the logic circuit 3130 through an input/output connection wiring 3135 that extends to the second structure 3100S from the first structure 3100F.

The controller 3200 includes a processor 3210, a NAND controller 3220 and a host interface 3230. The electronic system 3000 includes a plurality of semiconductor devices 3100, and the controller 3200 controls the plurality of semiconductor devices 3100. The processor 3210, a NAND interface 3221 included in the NAND controller 3220, and the host interface 3230 correspond to the processor 410, the memory interface 460 and the host interface 440 of FIG. 6, respectively.

Figure 26:
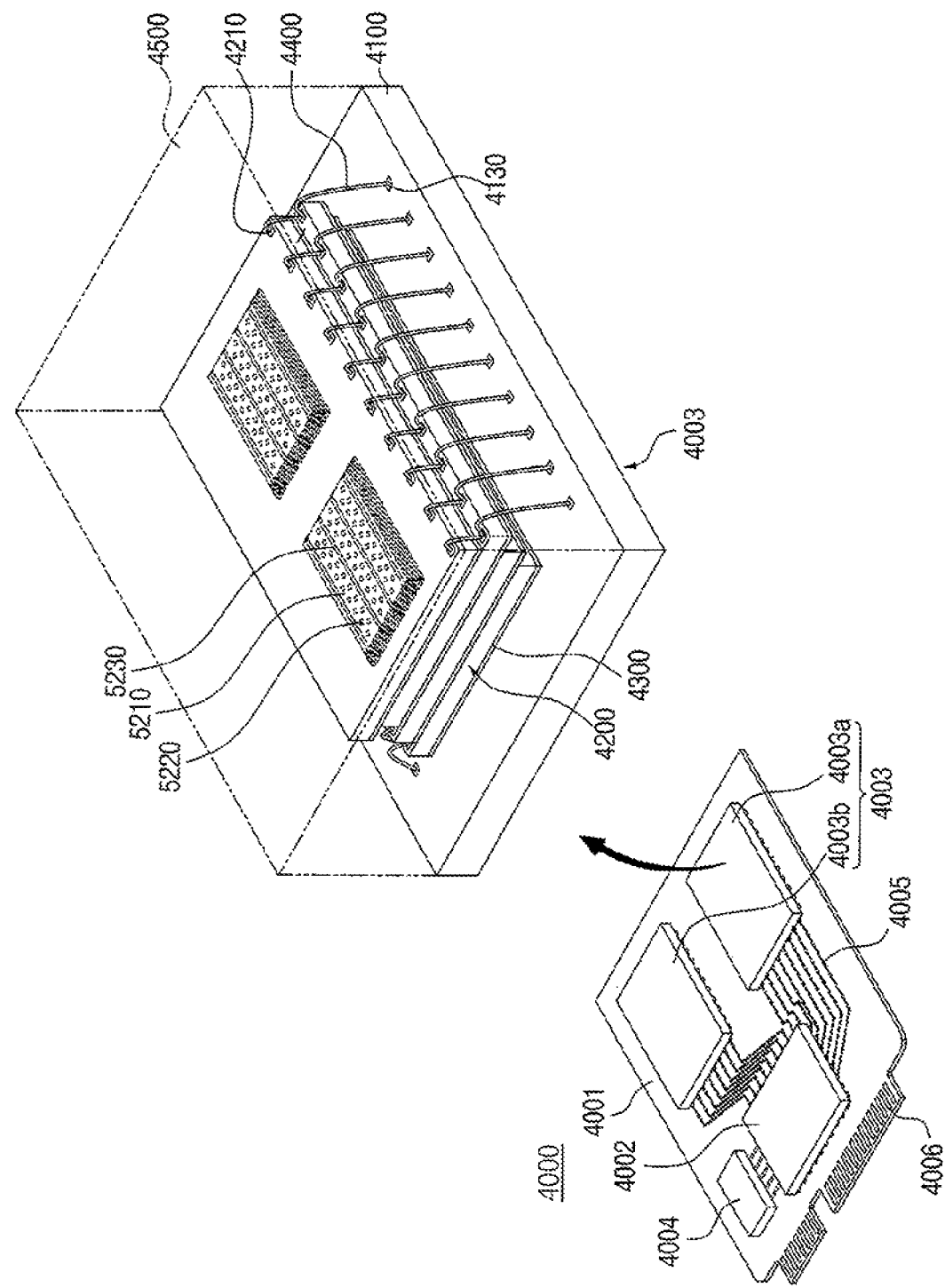
FIG. 26 is a perspective view of an electronic system that includes a nonvolatile memory device according to embodiments.

FIG. 26 is a perspective view of an electronic system that includes a nonvolatile memory device according to embodiments.

Referring to FIG. 26, in some embodiments, an electronic system 4000 includes a main substrate 4001, a controller 4002 mounted on the main substrate 4001, at least one semiconductor package 4003 mounted on the main substrate 4001, and a dynamic random access memory (DRAM) device 4004 mounted on the main substrate 4001. The semiconductor package 4003 and the DRAM device 4004 are connected to the controller 4002 by wiring patterns 4005 on the main substrate 4001.

The main substrate 4001 includes a connector 4006 that includes a plurality of pins connected to an external host. The number and layout of the plurality pins in the connector 4006 can be changed depending on a communication interface between the electronic system 4000 and the external host. In some embodiments, the electronic system 4000 is driven or operated by a power source received from the external host through the connector 4006.

The controller 4002 can write data to the semiconductor package 4003 or read data from the semiconductor package 4003, and can increase an operational speed of the electronic system 4000.

In an embodiment, the DRAM device 4004 is a buffer memory that reduces A speed difference for storing data between the semiconductor package 4003 and the external host. The DRAM device 4004 in the electronic system 4000 serve S as a cache memory, and provides space for temporarily storing data during control operations of the semiconductor package 4003.

The semiconductor package 4003 includes first and second semiconductor packages 4003a and 4003b that are spaced apart from each other. Each of the first and second semiconductor packages 4003a and 4003b includes a plurality of semiconductor chips 4200. Each of the first and second semiconductor packages 4003a and 4003b includes a package substrate 4100, the semiconductor chips 4200, bonding layers 4300 disposed under the semiconductor chips 4200, a connection structure 4400 that electrically connects the semiconductor chips 4200 with the package substrate 4100, and a mold layer 4500 that covers the semiconductor chips 4200 and the connection structure 4400 on the package substrate 4100.

In an embodiment, the package substrate 4100 is a printed circuit board (PCB) that includes package upper pads 4130. Each semiconductor chip 4200 includes an input/output pad 4210. The input/output pad 4210 corresponds to the input/output pad 3101 of FIG. 25. Each semiconductor chip 4200 includes gate electrode structures 5210, memory channel structures 5220 that extend through the gate electrode structures 5210, and division structures 5230 that divide the gate electrode structures 5210. Each semiconductor chip 4200 includes a nonvolatile memory device according to embodiments described with reference to FIG. 3.

In some embodiments, the connection structure 4400 is a bonding wire that electrically connects the input/output pad 4210 and the package upper pads 4130.

A nonvolatile memory device according to embodiments can be packaged using various package types or package configurations.

Embodiments of the inventive concept can be incorporated into various electronic devices and systems that include a nonvolatile memory device. For example, embodiments of the inventive concept can be incorporated into systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, or a drone, etc.

The foregoing is illustrative of embodiments and is not to be construed as limiting thereof. Although some embodiments have been described, those skilled in the art will readily appreciate that many modifications are possible in embodiments without materially departing from the novel teachings and advantages of the embodiments. Accordingly, all such modifications are intended to be included within the scope of embodiments as defined in the claims. Therefore, it is to be understood that the foregoing is illustrative of various embodiments and is not to be construed as limited to the specific embodiments disclosed, and that modifications to disclosed embodiments, as well as other embodiments, are intended to be included within the scope of the appended claims.

What is claimed is:

1. A method of searching a read voltage of a nonvolatile memory device that includes a plurality of memory cells that include a first state and a second state that differ from each other the method comprising:
   determining a number n that represents a number of times a data read operation is performed, where n is an integer greater than or equal to two;
   selecting n read voltage levels of the read voltage wherein a number of read voltage levels is equal to the number of times the data read operation is performed, wherein the n read voltage levels differ from each other;
   generating n cell count values by performing n data read operations on the plurality of memory cells using all of the n read voltage levels; and
   determining an optimal read voltage level of the read voltage by performing a regression analysis based on a first-order polynomial using the n read voltage levels and the n cell count values,
   wherein the read voltage distinguishes the first state and the second state.

2. The method of claim 1, wherein a read voltage level used in one of the n data read operations differs from read voltage levels used in a remainder of the n data read operations.

3. The method of claim 1, wherein:
   the n read voltage levels include a first read voltage level to an n-th read voltage level that differ from each other,
   the n data read operations include a first data read operation to an n-th data read operation that differ from each other, and
   the n cell count values include a first cell count value to an n-th cell count value that differ from each other.

4. The method of claim 3, wherein generating the n cell count values includes:
   obtaining the first cell count value by performing the first data read operation based on a read voltage that has the first read voltage level;
   obtaining a second cell count value by performing a second data read operation based on a read voltage that has a second read voltage level;
   obtaining third to (n−1)th cell count values by performing third to (n−1)th data read operations based on a read voltage that have a third to an (n−1)th read voltage level; and
   obtaining the n-th cell count value by performing the n-th data read operation based on a read voltage that has the n-th read voltage level.

5. The method of claim 3, wherein determining the optimal read voltage level of the read voltage includes:
   obtaining a first variable to an (n−1)-th variable based on the first to n-th read voltage levels and the first to n-th cell count values, wherein each of the first to (n−1)-th variables represents an amount of change in cell count values;
   obtaining a first function based on the first to (n−1)-th variables, wherein the first function is estimated as a first-order polynomial; and
   calculating the optimal read voltage level of the read voltage based on the first function.

6. The method of claim 5, wherein:
   a first voltage-cell count pair to an n-th voltage-cell count pair are formed based on the first to n-th read voltage levels and the first to n-th cell count values,
   a k-th voltage-cell count pair of the first to n-th voltage-cell count pairs includes a k-th read voltage level and a k-th cell count value, wherein k is an integer greater than or equal to one and less than or equal to n, and
   an (i+1)-th variable of the first to (n−1)-th variables is obtained based on an (i+1)-th voltage-cell count pair and an (i+2)-th voltage-cell count pair, wherein i is an integer greater than or equal to zero and less than or equal to (n−2).

7. The method of claim 6, wherein:
   the (i+1)-th variable includes an (i+1)-th averaged read voltage level and an (i+1)-th cell count change value,
   the (i+1)-th averaged read voltage level is obtained by dividing a sum of an (i+1)-th read voltage level and an (i+2)-th read voltage level by two, and
   the (i+1)-th cell count change value is obtained by subtracting an (i+1)-th cell count value from an (i+2)-th cell count value.

8. The method of claim 5, wherein the first function is defined by Y=aX+b (Equation 1), and the optimal read voltage level of the read voltage corresponds to an X-intercept of the first function.

9. The method of claim 8, wherein the X-intercept is obtained based on Equation 2, Equation 3 and Equation 4 as follows:

$$-\frac{b}{a} = \frac{\sum X_i^2 \sum Y_i - \sum X_i \sum X_i Y_i}{\sum X_i \sum Y_i - (n-1)\sum X_i Y_i};$$ Equation 2

$$X_i = (x_i + x_{i+1})/2;$$ Equation 3

$$Y_i = y_{i+1} - y_i,$$ Equation 4

Wherein, in Equation 3, $x_i$ and $x_{i+1}$ denote an (i+1)-th read voltage level and an (i+2)-th read voltage level, respectively, and i is an integer greater than or equal to zero and less than or equal to (n−2), and in Equation 4, $y_i$ and $y_{i+1}$ denote an (i+1)-th cell count value and an (i+2)-th cell count value, respectively.

10. The method of claim 1, wherein:
    determining the number n, selecting the n read voltage levels, and determining the optimal read voltage level of the read voltage are performed by a memory controller that controls the nonvolatile memory device, and
    generating the n cell count values is performed by the nonvolatile memory device.

11. The method of claim 1, wherein:
    determining the number n, and selecting the n read voltage levels are performed by a memory controller that controls the nonvolatile memory device, and
    generating the n cell count values, and determining the optimal read voltage level of the read voltage are performed by the nonvolatile memory device.

12. A method of reading data from a nonvolatile memory device that includes a plurality of memory cells that have a plurality of states, the method comprising:
    searching a plurality of read voltages that distinguish the plurality of states from each other; and
    reading the data stored in the plurality of memory cells based on the plurality of read voltages;
    wherein:
    the plurality of states include a first state and a consecutive second state that differ from each other, the plurality of read voltages include a first read voltage that distinguishes
the first state and the second state, and
searching the plurality of read voltages includes:
- determining a number n that represents a number of times a data read operation is performed, wherein n is an integer greater than or equal to two;
- selecting n first read voltage levels of the first read voltage wherein a number of first read voltage levels is equal to the number of times the data read operation is performed, wherein the n first read voltage levels differ from each other;
- generating n first cell count values by performing n data read operations on the plurality of memory cells using all of the n first read voltage levels; and
- determining a first optimal read voltage level of the first read voltage by performing a regression analysis based on a first-order polynomial using the n first read voltage levels and the n first cell count values.

13. The method of claim 12, wherein:
the plurality of states further include a third state that differs from the second state,
the plurality of read voltages further include a second read voltage that distinguishes the second state and the and third state, and
searching the plurality of read voltages further includes:
- selecting n second read voltage levels of the second read voltage wherein a number of second read voltage levels is equal to the number of times the data read operation is performed, wherein the n second read voltage levels differ from each other;
- generating n second cell count values by performing n data read operations on the plurality of memory cells using all of the n second read voltage levels; and
- determining a second optimal read voltage level of the second read voltage by performing the regression analysis based on the first-order polynomial using the n second read voltage levels and the n second cell count values.

14. The method of claim 12, further comprising:
performing an error correction code (ECC) decoding on the data read from the plurality of memory cells.

15. The method of claim 14, wherein the ECC decoding is performed by a memory controller that controls the nonvolatile memory device.

16. The method of claim 14, wherein the ECC decoding is performed by the nonvolatile memory device.

17. The method of claim 12, wherein the nonvolatile memory device is a NAND flash memory device.

18. The method of claim 12, wherein the plurality of memory cells include multi-level memory cells (MLCs) each of which stores two or more data bits.

19. The method of claim 12, wherein the plurality of memory cells are disposed in a vertical direction perpendicular to a substrate.

20. A method of searching a read voltage of a nonvolatile memory device that includes a plurality of memory cells that have a first state and a second state that differ from each other, the method comprising:
- determining a number n that represents a number of times a data read operation is performed, wherein n is an integer greater than or equal to two;
- selecting a first read voltage level to an n-th read voltage level of the read voltage wherein a number of read voltage levels is equal to the number of times the data read operation is performed, wherein the first to n-th read voltage levels differ from each other;
- generating a first cell count value to an n-th cell count value by performing a first data read operation to an n-th data read operation on the plurality of memory cells using all of the first to n-th read voltage levels;
- obtaining a first variable to an (n−1)-th variable based on the first to n-th read voltage levels and the first to n-th cell count values, wherein each of the first to (n−1)-th variables includes an averaged read voltage level and a cell count change value;
- obtaining a first function by performing a regression analysis based on a first-order polynomial using the first to (n−1)-th variables, wherein the first function is estimated as a first-order polynomial; and
- calculating an optimal read voltage level of the read voltage based on the first function,
wherein the optimal read voltage level of the read voltage is obtained based on Equation 1, Equation 2 and Equation 3, as follows:

$$-\frac{b}{a} = \frac{\sum X_i^2 \sum Y_i - \sum X_i \sum X_i Y_i}{\sum X_i \sum Y_i - n \sum X_i Y_i};  \quad \text{Equation 1}$$

$$X_i = (x_i + x_{i+1})/2; \quad \text{Equation 2}$$

$$Y_i = y_{i+1} - y_i, \quad \text{Equation 3}$$

wherein, in Equation 2, $X_i$ denotes an (i+1)-th averaged read voltage level, i is an integer greater than or equal to zero and less than or equal to (n−2), and $x_i$ and $x_{i+i}$ denote an (i+1)-th read voltage level and an (i+2)-th read voltage level, respectively, and in Equation 3, $Y_1$ denotes an (i+1)-th cell count change value, and $y_i$ and $y_{i+1}$ denote an (i+1)-th cell count value and an (i+2)-th cell count value, respectively,
wherein the read voltage distinguishes the first state and the second state.

* * * * *